(12) United States Patent
Zhou et al.

(10) Patent No.: US 12,414,336 B2
(45) Date of Patent: Sep. 9, 2025

(54) SEMICONDUCTOR STRUCTURE HAVING STACKED POWER RAILS

(71) Applicant: International Business Machines Corporation, Armonk, NY (US)

(72) Inventors: Huimei Zhou, Albany, NY (US); Ruilong Xie, Niskayuna, NY (US); Julien Frougier, Albany, NY (US); Miaomiao Wang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 742 days.

(21) Appl. No.: 17/561,636

(22) Filed: Dec. 23, 2021

(65) Prior Publication Data

US 2023/0207622 A1 Jun. 29, 2023

(51) Int. Cl.
| | |
|---|---|
| H10D 30/67 | (2025.01) |
| H01L 23/528 | (2006.01) |
| H01L 23/535 | (2006.01) |
| H10D 30/01 | (2025.01) |
| H10D 30/43 | (2025.01) |
| H10D 62/10 | (2025.01) |
| H10D 62/13 | (2025.01) |
| H10D 62/17 | (2025.01) |

(52) U.S. Cl.
CPC ..... H10D 30/6757 (2025.01); H01L 23/5286 (2013.01); H01L 23/535 (2013.01); H10D 30/014 (2025.01); H10D 30/43 (2025.01); H10D 30/6735 (2025.01); H10D 62/121 (2025.01); H10D 62/151 (2025.01); H10D 62/364 (2025.01)

(58) Field of Classification Search
CPC .............. H01L 23/5286; H01L 23/535; H10D 30/501–509; H10D 30/6753; H10D 84/851–853
See application file for complete search history.

(56) References Cited

U.S. PATENT DOCUMENTS

| | | |
|---|---|---|
| 10,475,692 B2 | 11/2019 | Licausi et al. |
| 10,586,765 B2 | 3/2020 | Smith et al. |
| 10,872,818 B2 | 12/2020 | Chiang et al. |
| 2020/0105603 A1* | 4/2020 | Chang ................ H10D 30/6211 |
| 2020/0135634 A1* | 4/2020 | Chiang ............... H10D 64/251 |
| 2021/0375861 A1 | 12/2021 | Chung et al. |

FOREIGN PATENT DOCUMENTS

WO 2023/118262 A1 6/2023

OTHER PUBLICATIONS

Cadence Community, "ITF: CEFTs and New Interconnect", Community blogs, Breakfast Bytes, Aug. 2, 2018, 12 pages.
(Continued)

*Primary Examiner* — Daniel P Shook
(74) *Attorney, Agent, or Firm* — L. Jeffrey Kelly; Otterstedt & Kammer PLLC

(57) ABSTRACT

Vertically stacked, buried power rails are electrically connected to wrap-around contacts or other electrically conductive liners on transistor source/drain regions. The buried power rails are electrically isolated from each other by an electrical insulator. Wrap-around contacts can be electrically connected to different ones of the vertically stacked, buried power rails or to the same buried power rail.

20 Claims, 16 Drawing Sheets

(56) References Cited

OTHER PUBLICATIONS

Chehab et al., "Standard cell architectures for N2 node: transition from FinFET to nanosheet and to forksheet device", Conference: Design-Process-Technology Co-optimization for Manufacturability XIV, Mar. 2020, 09 pages, DOI:10.1117/12.2548573.
Clarke Peter, "IMEC presents 'n-over-p' complementary FET proposal", Jun. 21, 2018, 02 pages, https://www.eenewseurope.com/en/imec-presents-n-over-p-complementary-fet-proposal/.
Gupta et al., "Buried Power Rail Scaling and Metal Assessment for the 3 nm Node and Beyond", 2020 IEEE International Electron Devices Meeting (IEDM), Dec. 2020, 04 pages, DOI: 10.1109/IEDM13553.2020.9371970,.
International Searching Authority, "Notification of Transmittal of the International Search Report and the Written Opinion of the International Searching Authority, or Declaration," Patent Cooperation Treaty Mar. 6, 2023, 11 pages, International Application No.-PCT/ EP2022/087176.
Prasad et al., "Buried Power Rails and Back-side Power Grids: Arm® CPU Power Delivery Network Design Beyond 5nm", 2019 IEEE International Electron Devices Meeting (IEDM), Dec. 2019, 05 pages, DOI: 10.1109/IEDM19573.2019.8993617.
Semi Wiki "VLSI Symposium 2020-IMEC Buried Power Rail", by Scotten Jones, downloaded Apr. 23, 2025 from https://semiwiki.com/semiconductor-services/techinsights/288782-vlsi-symposium-2020-imec-buried-power-rail/, 04 pages, article dated Jul. 26, 2020.

\* cited by examiner

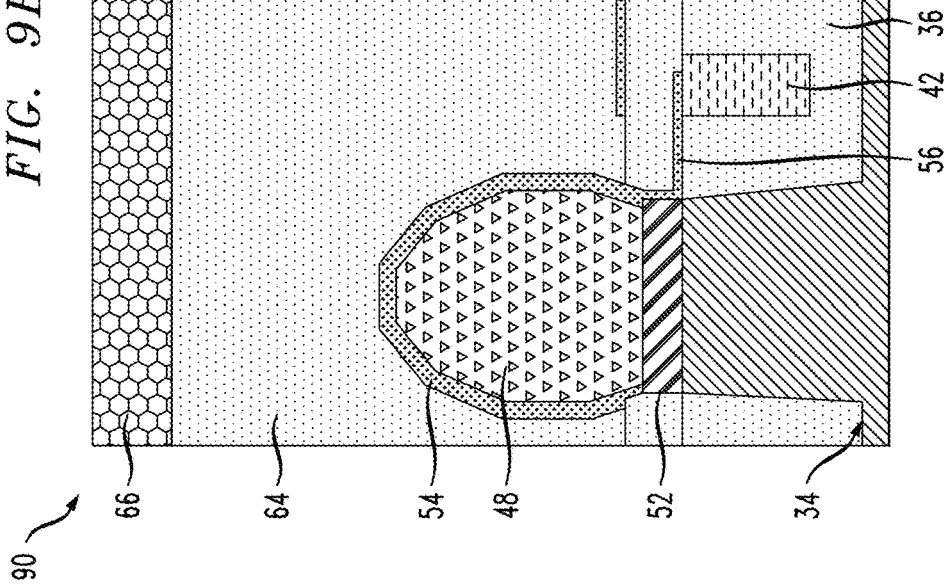
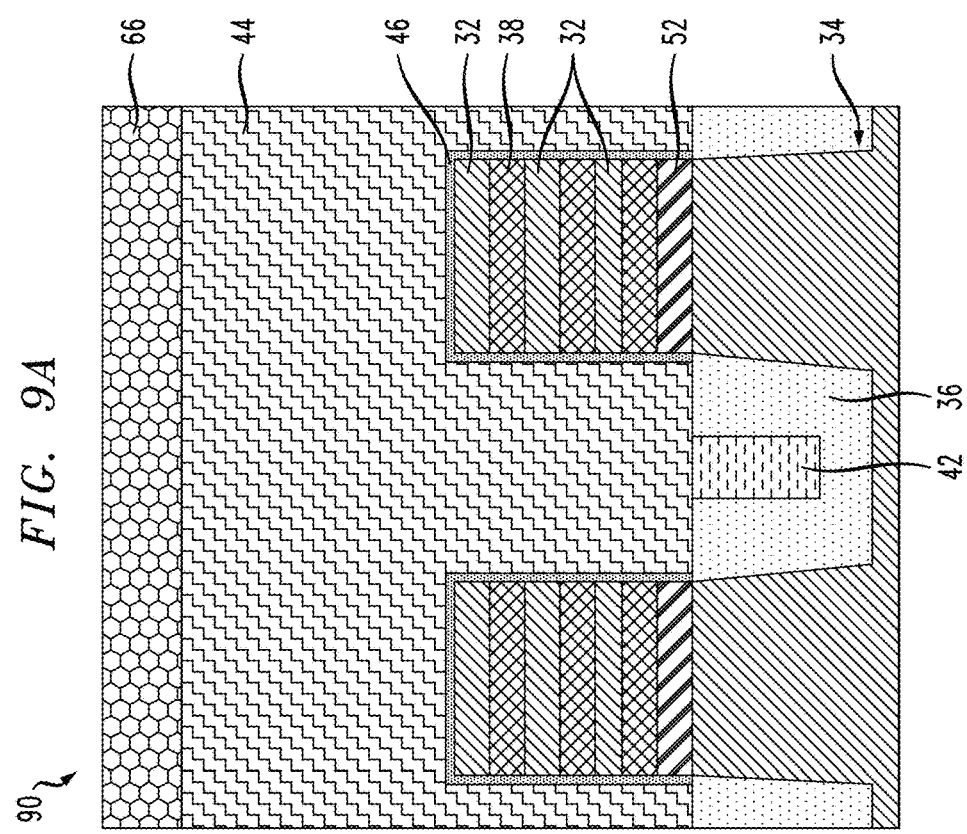

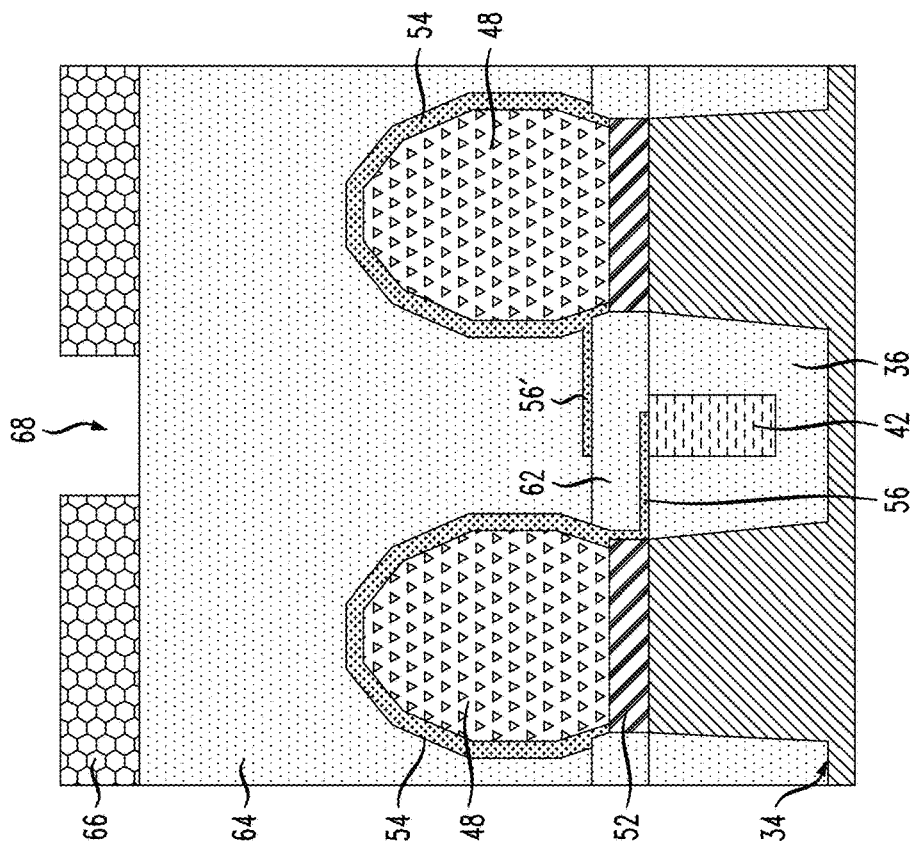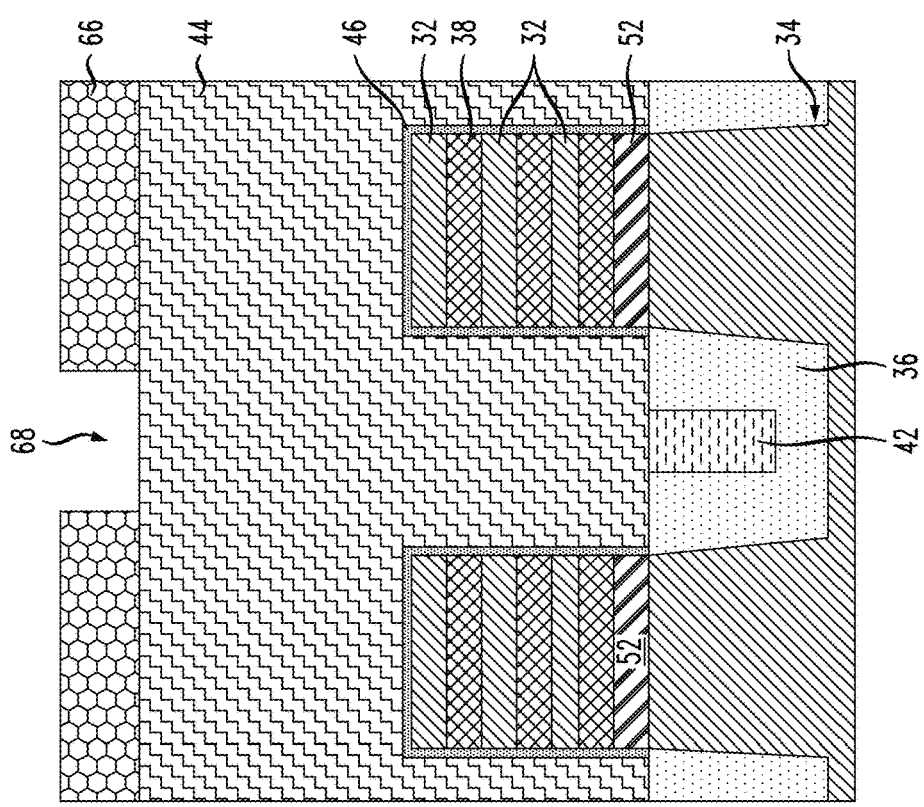

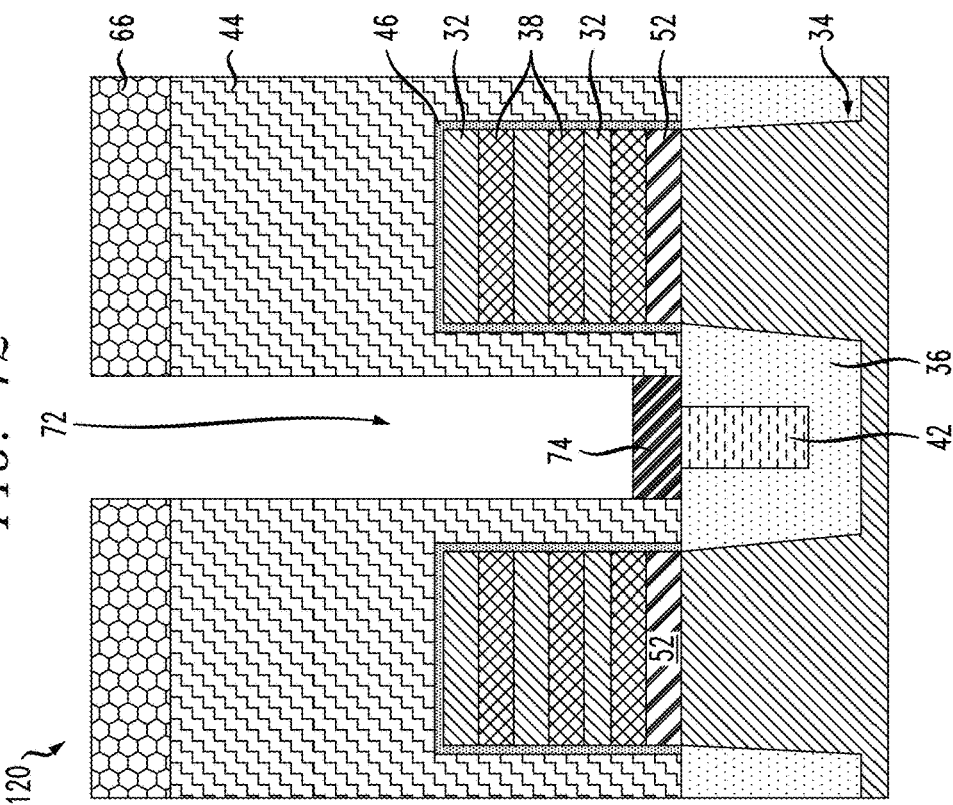
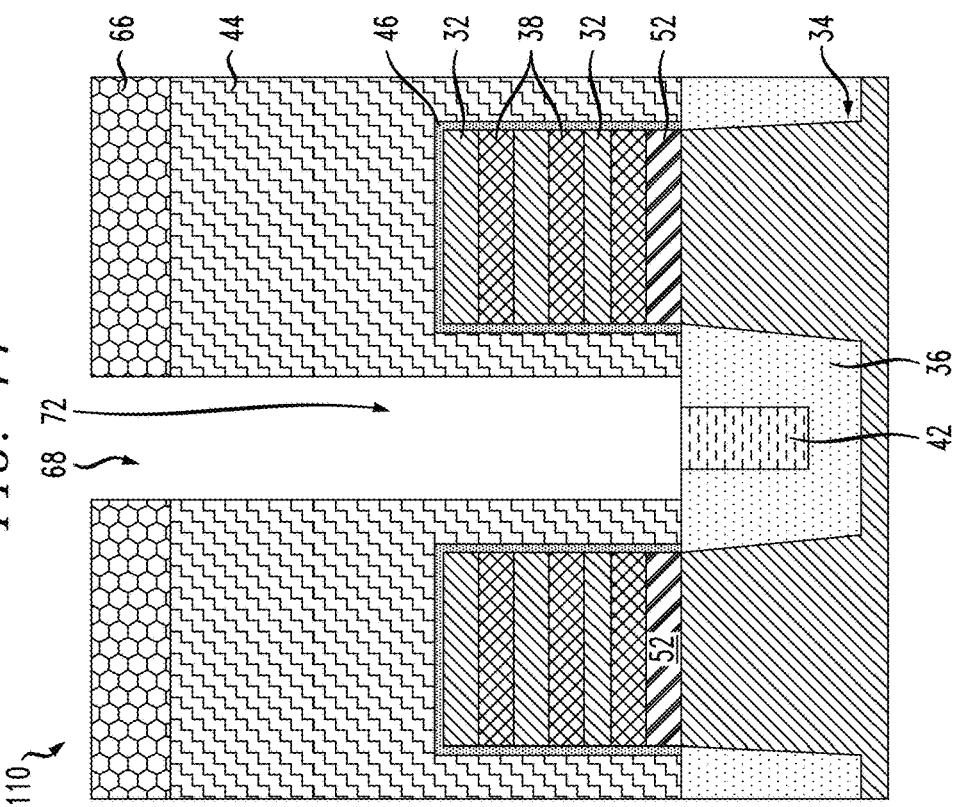

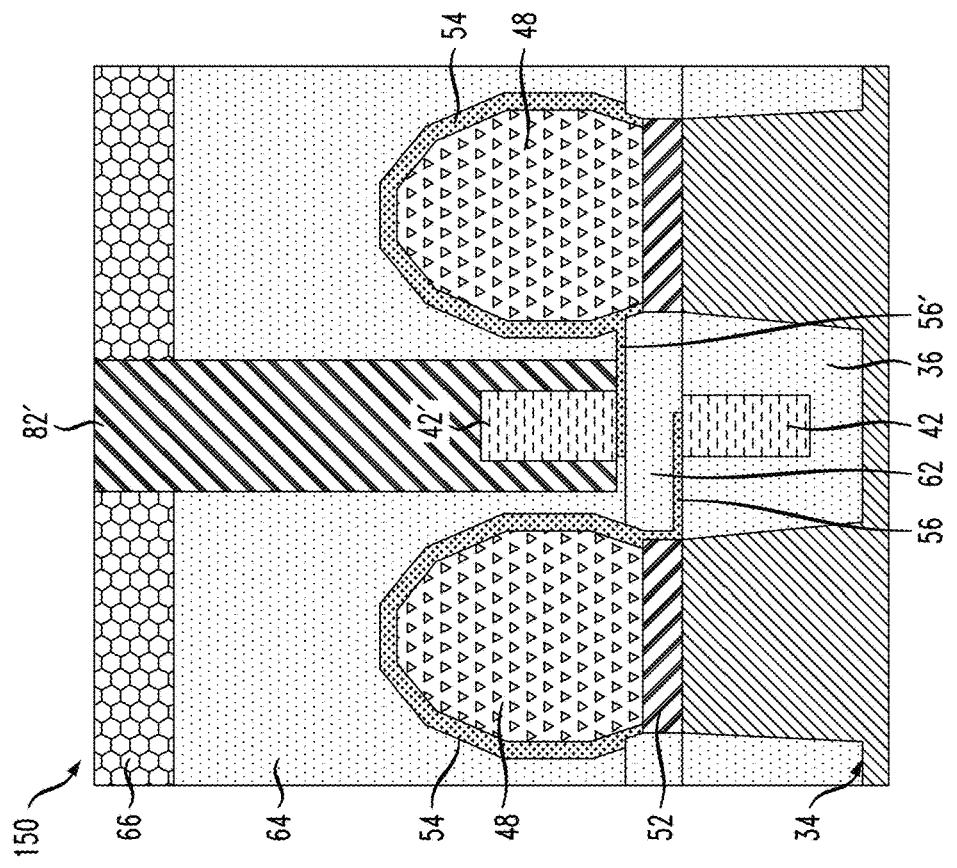
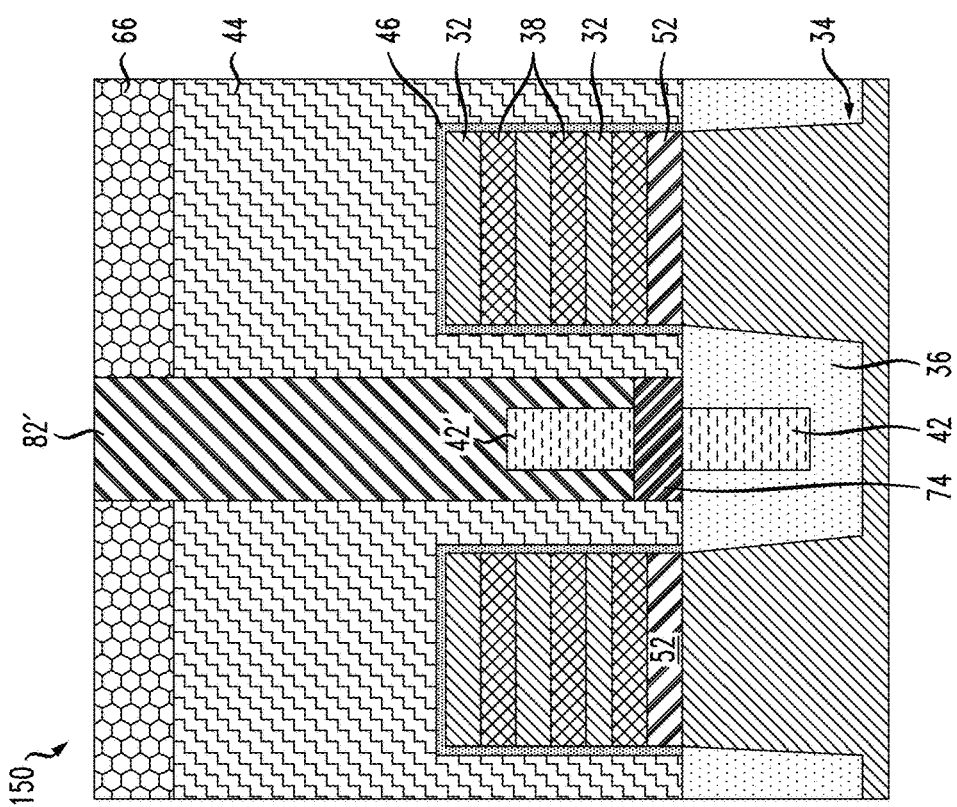

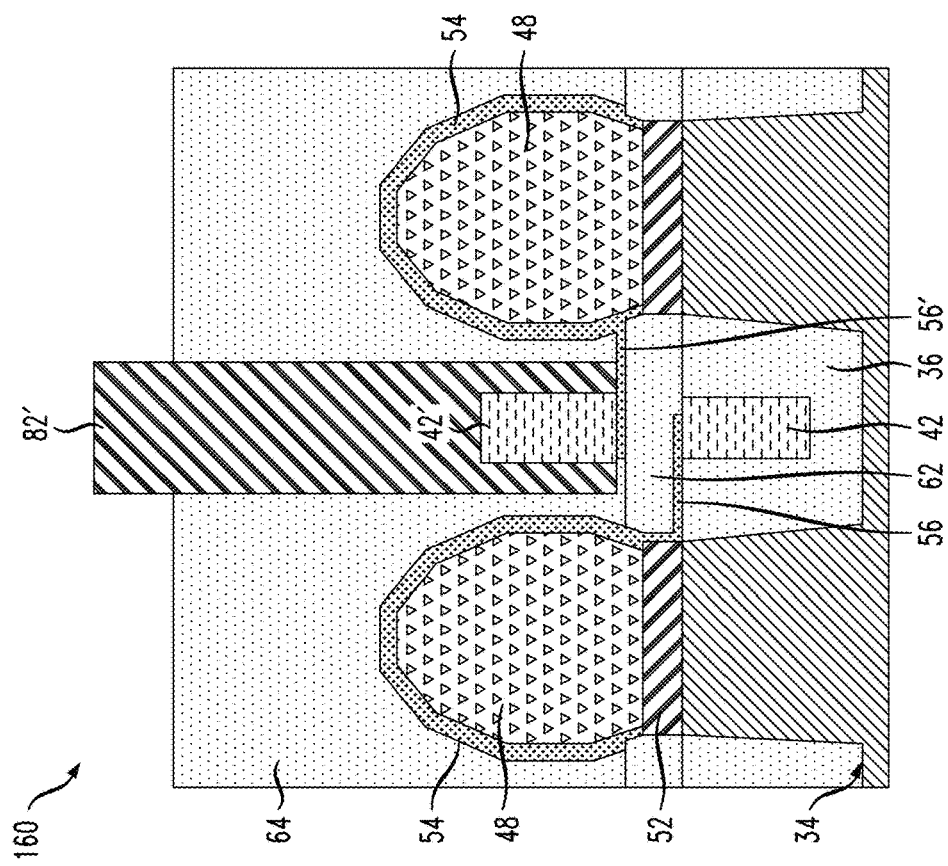
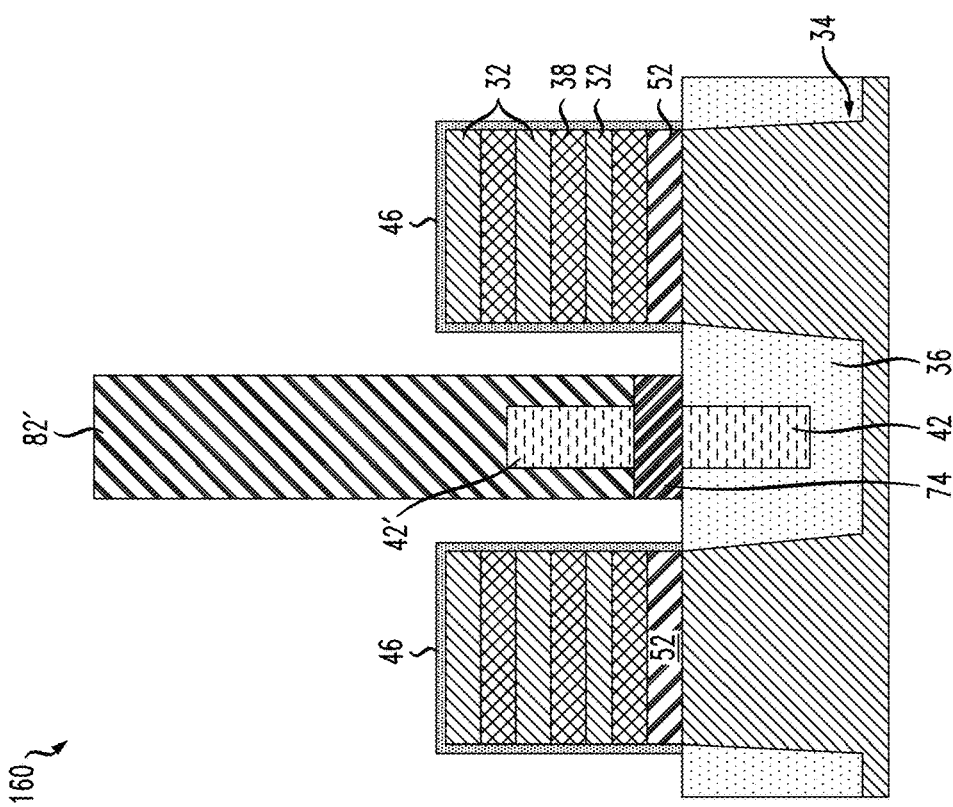

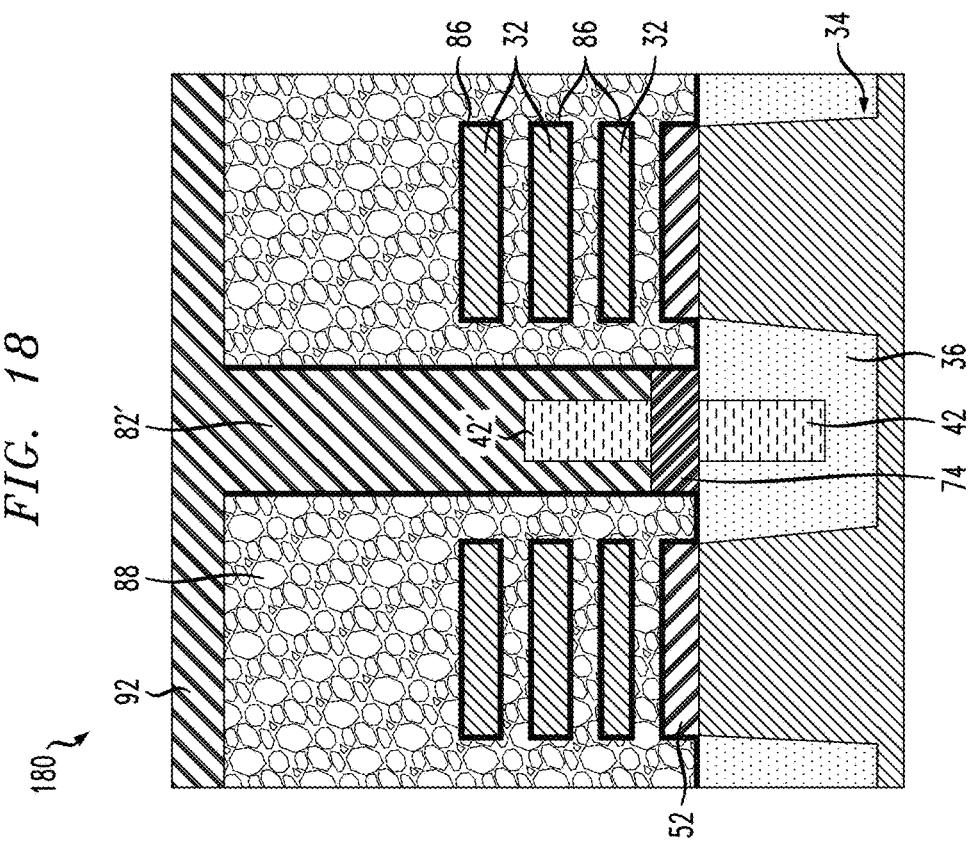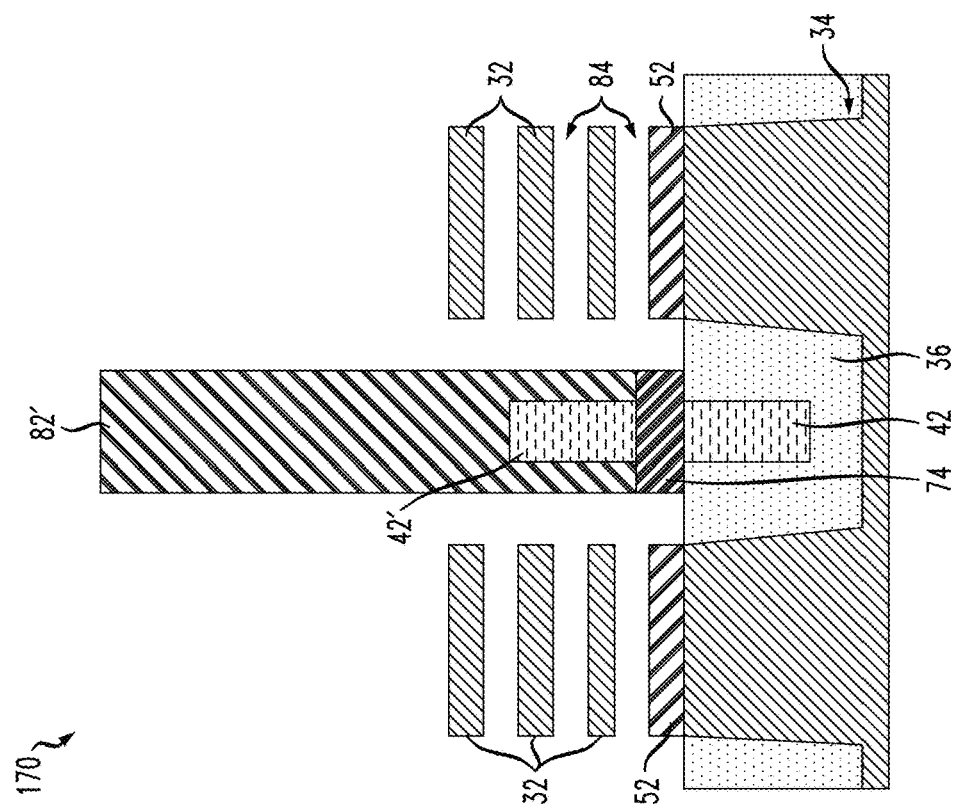

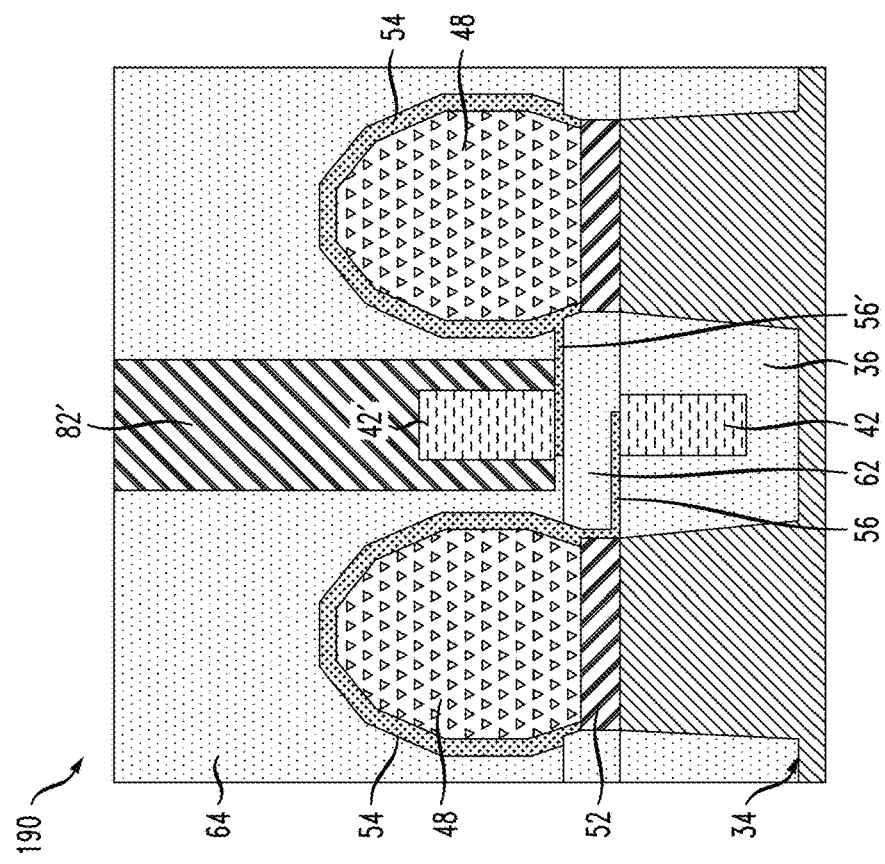
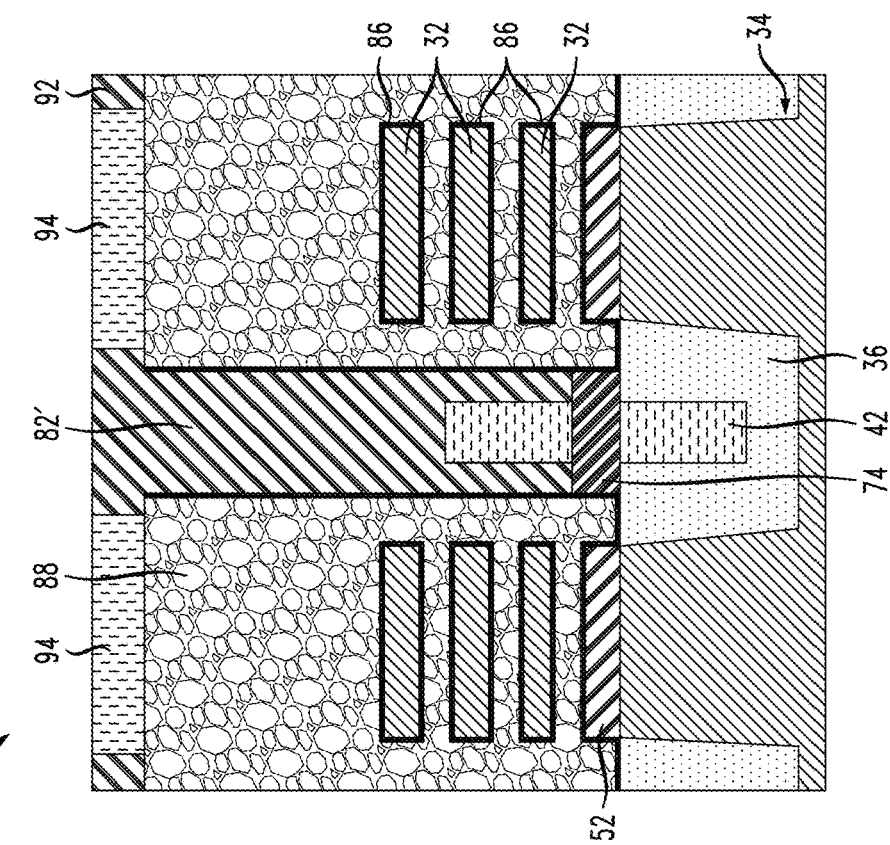
FIG. 19A
FIG. 19B

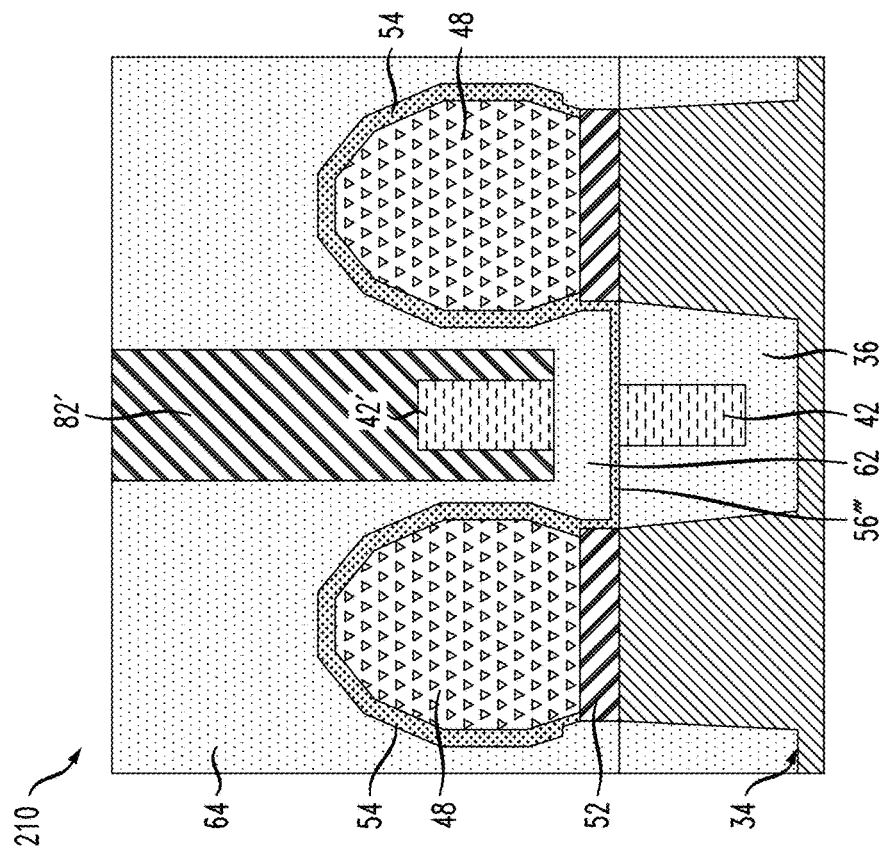
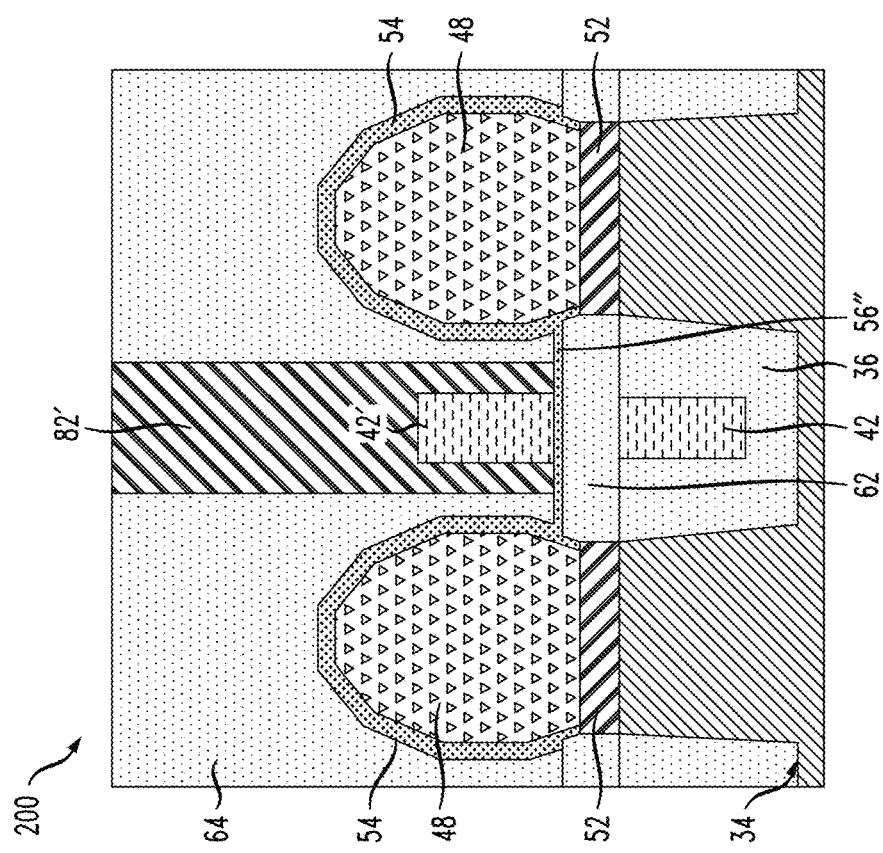

US 12,414,336 B2

SEMICONDUCTOR STRUCTURE HAVING STACKED POWER RAILS

BACKGROUND

The present invention relates generally to the electrical, electronic and computer arts and, more particularly, to semiconductor structures having stacked power rails and their fabrication.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

FinFET, nanosheet and other FETs have been under development for possible use in tight pitch applications. Nanosheet FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs. Spacers are employed for electrically isolating the gates from the source/drain regions of nanosheet transistors. Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is typically set by oxide thickness and etched fin height.

Electrical power is provided to integrated circuits using electrically conductive power rails. Such power rails can be electrically connected, for example, to source/drain regions of FETs incorporated within integrated circuits.

BRIEF SUMMARY

In accordance with one aspect of the invention, a semiconductor structure includes a semiconductor substrate including a first active region and a second active region, the first active region being electrically isolated from the second active region. A first field-effect transistor on the first active region includes a first gate structure, a first channel region, and a first pair of source/drain regions adjoining the first channel region. A first electrically conductive liner is on each source/drain region of the first field-effect transistor. A second field-effect transistor on the second active region includes a second gate structure, a second channel region, and a second pair of source/drain regions adjoining the second channel region. A bottom buried power rail is between the first and second active regions and a top buried power rail is vertically above the bottom power rail. An electrical isolation layer is between the bottom buried power rail and the top buried power rail. A first electrical connector electrically connects the first electrically conductive liner and one of the bottom buried power rail and the top buried power rail and a second electrical connector electrically connects a second electrically conductive liner on the second pair of source/drain regions and one of the bottom buried power rail and the top buried power rail.

In a further aspect of the invention, method of forming a semiconductor structure includes obtaining a monolithic semiconductor structure including a first active region, a second active region, and an electrical isolation region between the first active region and the second active region, the first active region including a first channel region and the second active region including a second channel region. A bottom buried power rail is formed within the electrical isolation region. A sacrificial gate layer is formed over the first and second active regions and adjoins the first channel region and the second channel region. The method further includes epitaxially forming a first pair of source/drain regions on opposite sides of the first channel region and forming a first electrically conductive liner on the first pair of source/drain regions. A second pair of source/drain regions is epitaxially formed on opposite sides of the second channel region and a second electrically conductive liner is formed on the second pair of source/drain regions. An electrical isolation layer is formed over the bottom buried power rail. A top buried power rail is formed vertically above the bottom buried power rail and is electrically isolated from the bottom buried rail by the electrical isolation layer. The method further includes forming a first metal connector extending laterally from the first electrically conductive liner and contacting one of the bottom buried power rail and the top buried power rail, forming a second metal connector extending laterally from the second electrically conductive liner and contacting one of the bottom buried power rail and the top buried power rail, and depositing a dielectric layer over the top buried power rail.

Techniques and structures as disclosed herein can provide substantial beneficial technical effects. By way of example only and without limitation, one or more embodiments may provide one or more of the following advantages:

Vertically stacked buried power rails;
A scaling booster in future logic architectures;
A performance booster with relaxed dimensions by moving power line under and between devices.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 9A is a first schematic, cross-sectional view of the structure as shown in FIG. 8 following deposition of a hard mask thereon;

FIG. 9B is a second schematic, cross-sectional view of the structure as shown in FIG. 8 following deposition of a hard mask thereon;

FIG. 10A is a schematic, cross-sectional view of the structure as shown in FIG. 9A following patterning of the hard mask;

FIG. 10B is a schematic, cross-sectional view of the structure as shown in FIG. 9B following patterning of the hard mask;

FIG. 11 is a schematic, cross-sectional view of the structure as shown in FIG. 10A following an etch of the sacrificial layer down to the bottom buried power rail;

FIG. 12 is a schematic, cross-sectional view of the structure as shown in FIG. 11 following deposition of an electrically insulating layer over the bottom buried power rail;

FIG. 15A is a schematic, cross-sectional view of the structure as shown in FIG. 14A following deposition of a dielectric fill over the top buried power rail;

FIG. 15B is a schematic, cross-sectional view of the structure as shown in FIG. 14B following deposition of a dielectric fill over the top buried power rail;

FIG. 16A is a schematic, cross-sectional view of the structure as shown in FIG. 15A following removal of the hard mask and sacrificial layer;

FIG. 16B is a schematic, cross-sectional view of the structure as shown in FIG. 15B following removal of the hard mask and sacrificial layer;

FIG. 17 is a schematic, cross-sectional view of the structure as shown in FIG. 16A following removal of silicon germanium layers from a stack of semiconductor nanosheets;

FIG. 18 is a schematic, cross-sectional view of the structure as shown in FIG. 17 following gate stack formation;

FIG. 19A is a schematic, cross-sectional view of the structure as shown in FIG. 18 following gate contact formation;

FIG. 19B is a further schematic, cross-sectional view of the structure shown in FIG. 19A following contact metallization;

FIG. 20 is a schematic, cross-sectional view of a semiconductor structure in accordance with a first alternative embodiment;

FIG. 21 is a schematic, cross-sectional view of a semiconductor structure in accordance with a second alternative embodiment;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

An exemplary sequence of steps that may be employed for forming stacked, buried power rails is shown in the figures. While the disclosed methods and the resulting structures relate to GAA nanosheet architectures, the principles of the inventions can also be applied to other FET architectures such as FinFETs.

Figure 1:
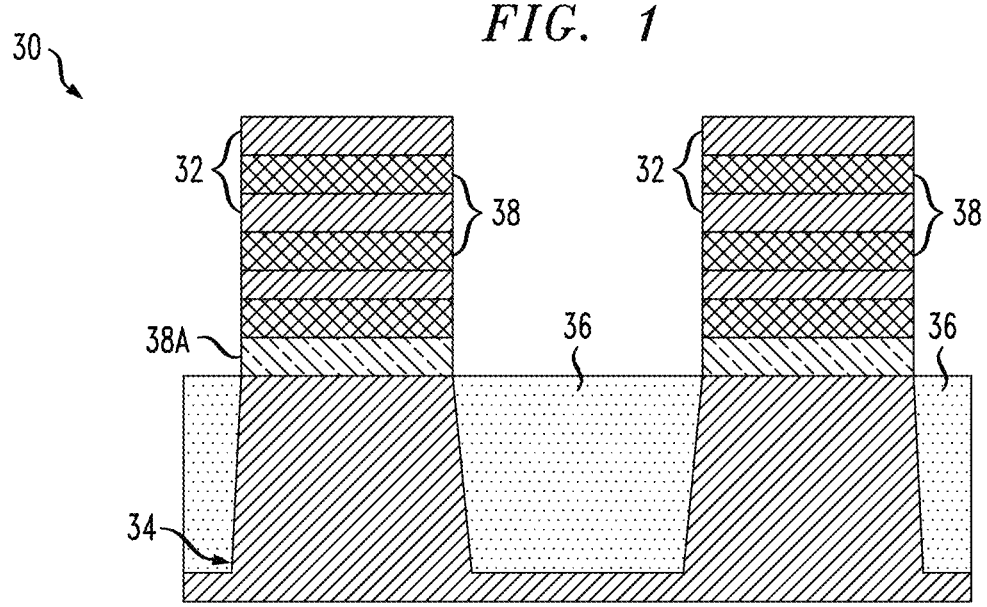
FIG. 1 is a schematic, cross-sectional view showing selected elements of a monolithic semiconductor structure.

An exemplary monolithic structure 30 as shown in FIG. 1 may be obtained during a fabrication process in which GAA nanosheet architectures are provided. Various techniques are known to the art for fabricating such architectures and similar architectures and new techniques continue to be developed. The exemplary structure 30 includes stacks of alternating semiconductor channel layers 32. The semiconductor channel layers 32 may be, for example, silicon nanosheets. The nanosheets can be formed on a semiconductor-on-insulator substrate or on a bulk semiconductor substrate such as a bulk silicon substrate. Shallow trench isolation (STI) regions 36 formed within the semiconductor substrate 34 provide electrical isolation of active regions including neighboring transistors or other devices that may be formed on the substrate. In an exemplary embodiment, the active regions of the substrate 34 comprise monocrystalline silicon fins, though impurities may be present within the crystalline structure, and the STI regions comprise silicon dioxide. Single crystal silicon wafers are commercially available and are characterized by a diamond cube lattice structure. As known in the art, the Miller indices of a substrate are determined from the reciprocals of the points at which the crystal plane of silicon intersects the principal crystalline axes. Exemplary embodiments as described herein relate to structures including doped or undoped (100) silicon as a substrate material.

In one or more exemplary embodiments, the semiconductor channel layers 32 each have a thickness in the range of four to fifteen nanometers (4-15 nm). The number of semiconductor (channel) layers in the semiconductor layer stack may vary depending on the desired uses and capabilities of the nanosheet transistors to be fabricated. The channel layers 32 may consist essentially of monocrystalline silicon layers, possibly including impurities, and are spaced six to twenty nanometers (6-20 nm) apart in some embodiments. The width of each semiconductor channel layer 32 is about ten to one hundred nanometers (10-100 nm) in some embodiments, though this range should be considered exemplary as opposed to restrictive.

Sacrificial silicon germanium layers 38 between the channel layers 32 are replaced later in the fabrication process by metal gate and gate dielectric materials that form gate-all-around structures (gate stacks). Silicon and silicon germanium layers can be epitaxially grown in alternating sequence to obtain a vertical stack having the desired number of silicon (channel) layers. The silicon germanium layers 38 may have the composition $Si_{1-x}Ge_x$ where x is between 0.1 and 0.8 to allow selective etching with respect to silicon.

A silicon germanium buffer layer 38A may be epitaxially grown on the semiconductor substrate 34. The germanium content of the buffer layer is higher than that of the sacrificial silicon germanium layers 38. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Figure 2:
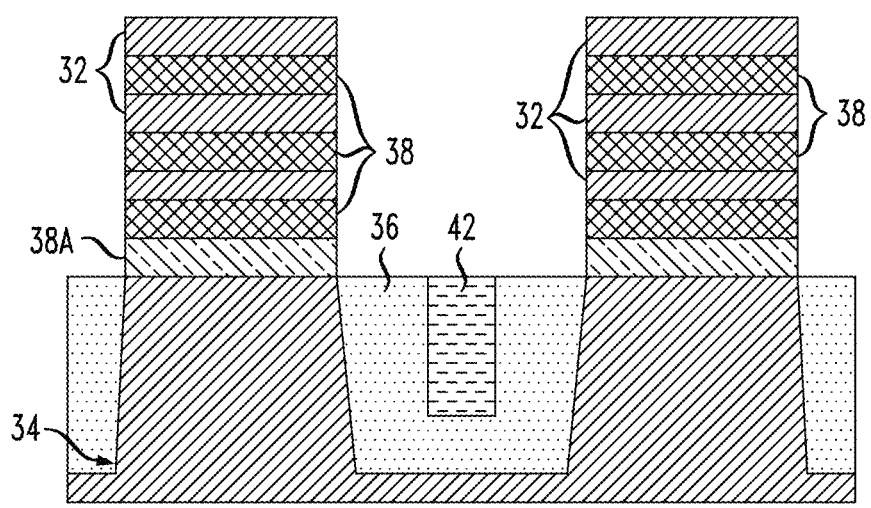
FIG. 2 is a schematic, cross-sectional view of the structure shown in FIG. 1 following formation of a buried bottom power rail.

Referring to FIG. 2, a bottom buried power rail (BPR) 42 is formed within one or more of the STI regions 36. Parallel power rails (not shown) in multiple STI regions are formed in some exemplary embodiments. In one exemplary embodiment, an electrically conductive material such as tungsten (W) is deposited within a trench formed in the STI region 36 using chemical vapor deposition, plating or other suitable deposition process. The bottom end of the trench is above the top surface of the semiconductor substrate 34 such that the BPR is electrically isolated therefrom. Metal overburden is removed using a chemical mechanical planarization process and the remaining metal is then recessed down to the top surface of the STI region 36. The height and width dimensions of the resulting bottom buried power rail 42 are between ten and fifty nanometers (10-50 nm) in an exemplary embodiment. It will be appreciated that metals or combinations of metals other than tungsten may be employed to form the buried power rail(s), including but not limited to copper and cobalt.

Figure 3:
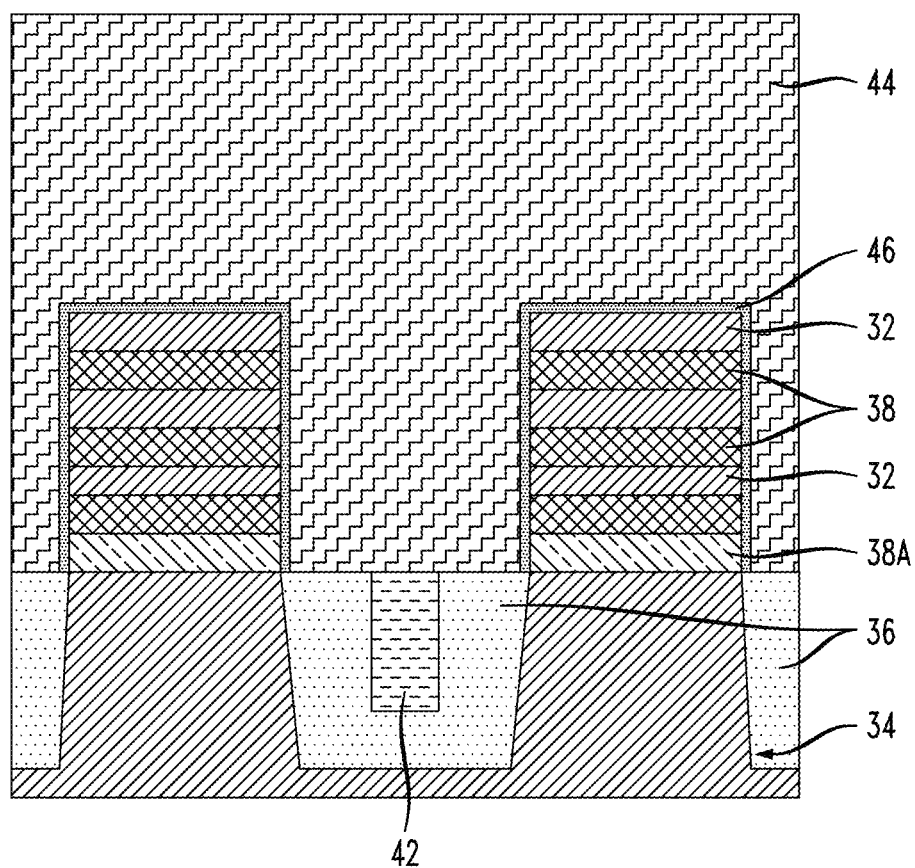
FIG. 3 is a schematic, cross-sectional view of the structure shown in FIG. 2 following deposition of a sacrificial layer.

A sacrificial gate layer 44 is formed over the stacks of nanosheet layers and the STI regions 36, as schematically illustrated in FIG. 3. The sacrificial gate layer 44 may comprise, for example, amorphous silicon (a-Si) or polycrystalline silicon (polysilicon). Sacrificial gate material used to form the sacrificial gate layer 44 may be formed using, for example, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial gate layer adjoins a thin oxide liner 46 on the top surface of the stacks of nanosheet layers. A layer of silicon dioxide may be deposited conformally on the nanosheet stacks to form the oxide layer on the top surfaces and sidewalls thereof.

Figure 4A:
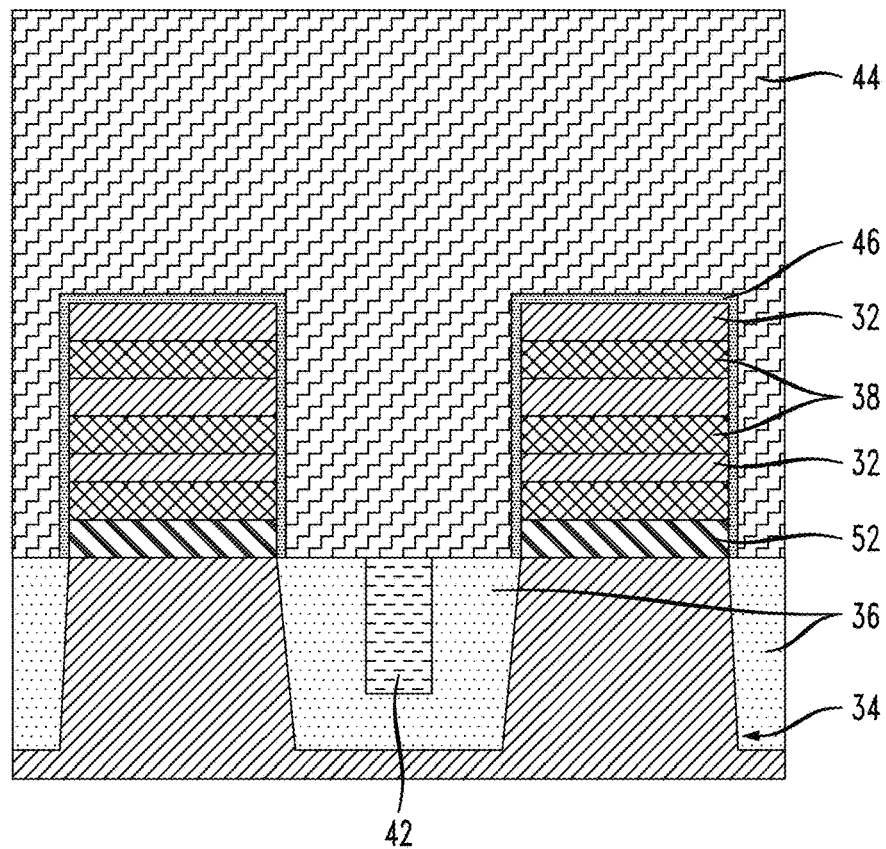
FIG. 4A is a schematic, cross-sectional view of the structure shown in FIG. 3 following a selective etch of the sacrificial material and growth of epitaxial source/drain regions.
Figure 4B:
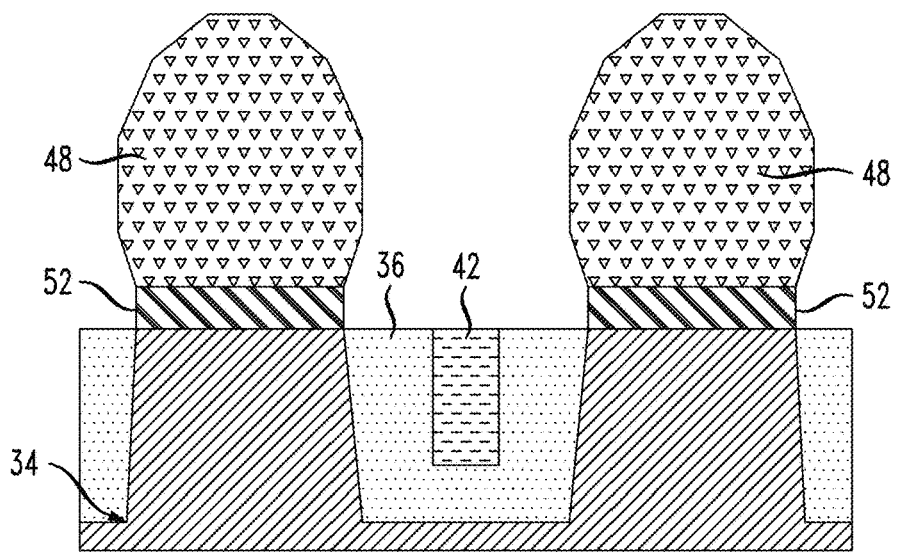
FIG. 4B is a further schematic, cross-sectional view of the structure shown in FIG. 3 following a selective etch of the sacrificial material and growth of epitaxial source/drain regions.

FIGS. 4A and 4B are sectional views illustrating the structure shown in FIG. 3 following a partial etch of the sacrificial gate layer 44 to expose parts of the nanosheet stacks and then remove them, followed by epitaxial growth of source/drain regions 48. Source/drain regions may be merged in some embodiments. A reactive ion etch (ME) is employed to remove material from the sacrificial gate layer 44 in some embodiments, forming trenches therein. The portions of the sacrificial gate layer 44 protected by a hard mask (not shown) remain essentially intact, as shown in FIG. 4A.

The source/drain regions 48 may be electrically isolated from the semiconductor substrate 34 by a bottom dielectric isolation (BDI) layer 52. The BDI layer 52 is formed by selectively etching the sacrificial layer 38A and filling in the resulting space with the isolation layer material before source/drain regions are formed. Dopants within the source/drain regions 48 may be incorporated in situ using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). An nFET region(s) includes transistors having n-type source/drain regions while the pFET region(s) includes p-type source/drain regions. The use of a BDI layer is optional to the fabrication of nFET and pFET transistors as described herein.

Figure 5:
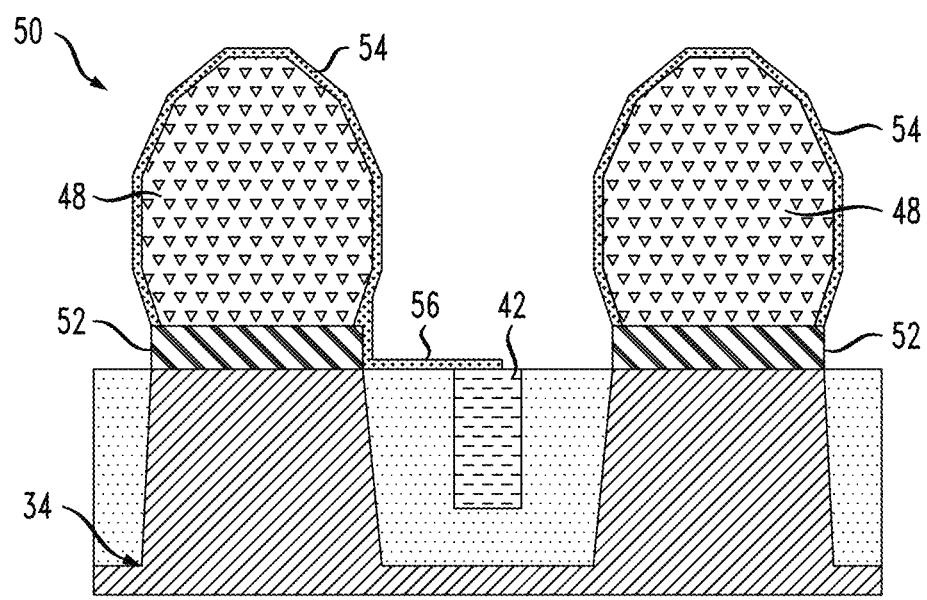
FIG. 5 is a schematic, cross-sectional view of the structure as shown in FIG. 4B following formation of wrap-around contacts and electrical connection to the bottom buried power rail.

Wrap-around contacts (WACs) 54 and a bottom buried power rail connector to the bottom power rail are formed to obtain an exemplary structure 50 as schematically illustrated in FIG. 5. An electrically conductive liner wrapping around the source/drain regions 48 may be formed by conformal deposition of a titanium (Ti) liner or other suitable metal liner using CVD. Deposition of the electrically conductive liner may be followed by an annealing step at this stage of the process or later to form titanium silicide and/or titanium-based germano-silicide layers on the source/drain regions. A conformal film is understood as having substantially uniform thickness. In some exemplary structures including both nFET and pFET regions, annealing causes the source/drain regions within the nFET region(s) to include TiSi$_2$ layers while titanium germano-silicide (Ti(SiGe)$_2$) layers are formed on the source/drain regions in the pFET region(s). The terms titanium silicide and metal silicide as used hereafter are intended to encompass silicides formed on either silicon or silicon germanium. The thickness of the Ti liner may, for example, be in the range of two to five nanometers (2 nm to 5 nm). The liner further extends from at least one set of source/drain regions 48 in the exemplary structure 50 over the STI region 36 and at least partially over the bottom buried power rail 42 within the STI region, forming an electrical connector 56 between the wrap-around contact(s) and the bottom buried power rail. In some embodiments, the WAC 54, but not the electrical connector 56, comprises a metal silicide. In this exemplary structure 50, the wrap-around contacts on source/drain regions on the opposite side of the STI region 36 are not electrically connected to the bottom buried power rail.

Following deposition of the metal layer employed to form the WACs 54 and electrical connector 56, a patterned mask (not shown) is formed on the resulting structure to protect the portions of the metal layer that are intended to remain thereon while exposing other portions of the metal layer to be removed. A portion of the metal layer extending horizontally over the top surfaces of the STI region 36 and the embedded, bottom buried power rail 42 is removed by a selective etch. The resulting electrical connector 56 will accordingly extend only partially across the STI region 36 in the exemplary structure 50 while overlapping and directly contacting at least part of the top surface of the bottom buried power rail 42. As discussed below, the source/drain regions on both sides of an STI region can be electrically connected to the bottom buried power rail by electrical connectors formed on the top surface of the STI region. In other embodiments, the bottom buried power rail is not connected to either of the source/drain regions on opposite sides thereof.

Figure 6:
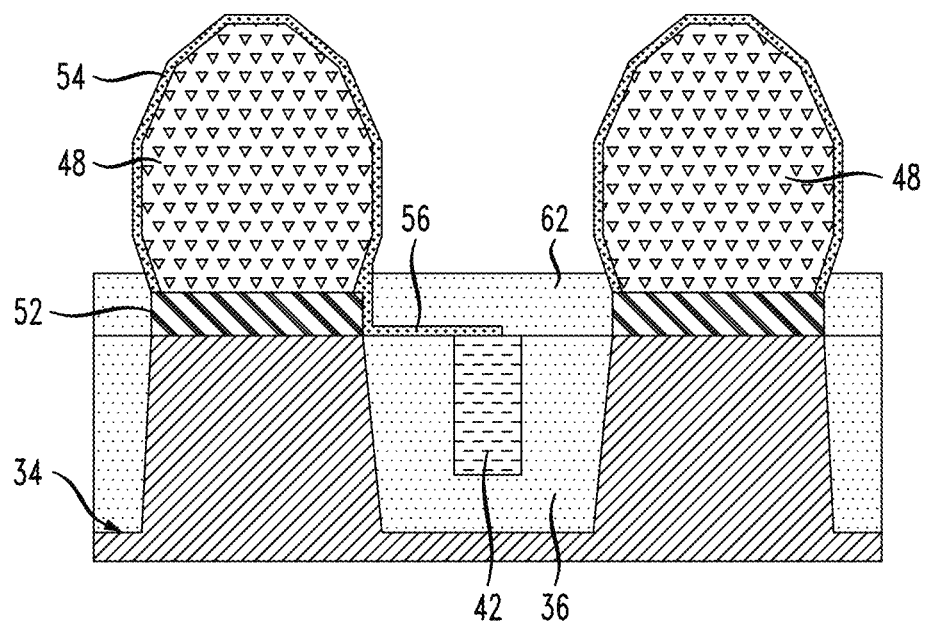
FIG. 6 is a schematic, cross-sectional view of the structure as shown in FIG. 5 following deposition and subsequent recessing of an oxide layer.

Referring to FIG. 6, an oxide layer 62 is deposited on the structure 50 and recessed to obtain a monolithic structure 60 wherein the bottom buried power rail 42 and the electrical connector 56 are covered by the oxide layer 62. A silicon dioxide layer having the same electrical properties as the silicon dioxide comprising the STI region 36 may, for example, be employed. The oxide layer 62 is etched back to expose portions of the wrap-around contacts 54.

Figure 7:
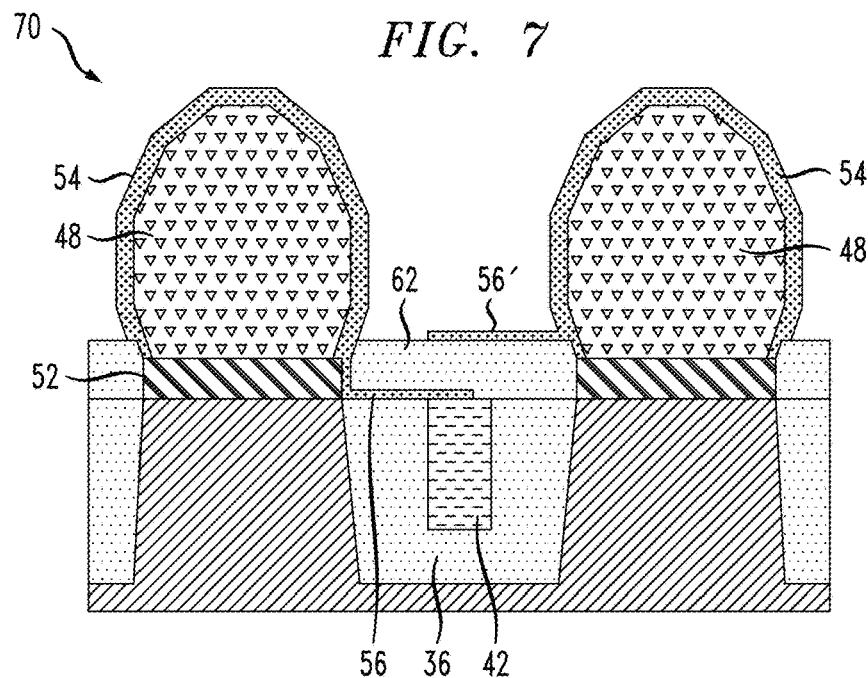
FIG. 7 is a schematic, cross-sectional view of the structure as shown in FIG. 6 following formation of an electrically conductive connector on the oxide layer.

A further electrical connector 56' is formed on the top surface of the oxide layer 62 and is integral with the wrap-around contact 54 on a source/drain region 48 on a side of the STI region 36 opposite from the side from which the previously formed electrical connector 56 extends. A portion of the deposited metal layer forming the further (top) electrical connector 56' is removed such that it remains electrically connected to only the wrap-around contact 54 on one side of the STI region 36. A portion of the top surface of the oxide layer 62 is accordingly exposed following selective removal of the portion of the metal layer. As discussed above, the wrap-around contacts 54 can be metal or metal silicide at this stage of the process. A monolithic structure 70 as schematically illustrated in FIG. 7 may be obtained. The electric connectors 56, 56' comprise the same material and are parallel to each other in an exemplary embodiment. Portions of the electrical connectors 56, 56' are in overlapping relationship to each other, the oxide layer 62 electrically isolating the overlapping portions.

Figure 8:
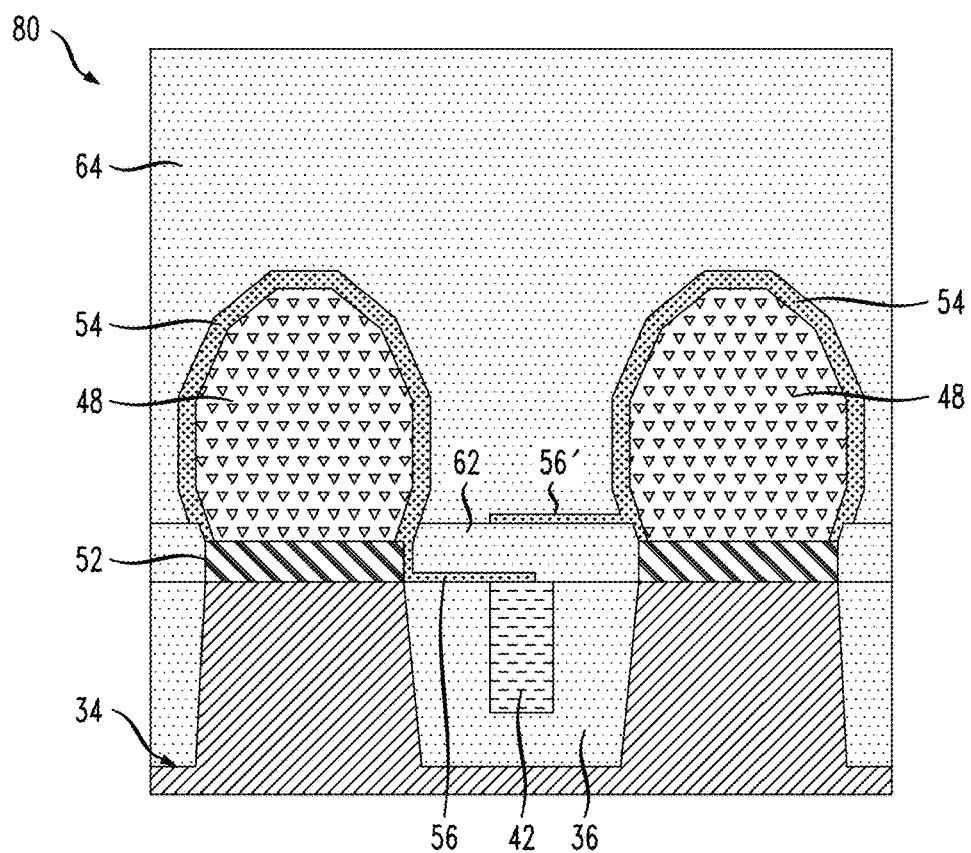
FIG. 8 is a schematic, cross-sectional view of the structure as shown in FIG. 7 following deposition of an interlevel dielectric (ILD) layer.

An interlevel dielectric (ILD) layer 64, for example silicon dioxide (SiO$_2$) or any other material with similar functional properties, is formed by chemical vapor deposition (CVD) or any other suitable deposition technique, over the monolithic structure 70. As schematically illustrated in FIG. 8, the ILD layer 64 extends over the source/drain regions 48 and associated wrap-around contacts of the resulting structure 80. The ILD layer is planarized down to the top surface of the sacrificial gate layer 44.

The interlevel dielectric layer may, in some exemplary embodiments, comprise a conformal oxide such as ALD silicon dioxide. Flowable ILD materials may be employed in one or more embodiments. A substantially carbon free silicon oxide (SiO$_2$) material can, for example, be deposited using FCVD. Flowable chemical vapor deposition (FCVD) provides for a liquid-like film that flows freely into trench-like geometries to provide a bottom up, void-free and seam-free fill. Other dielectric materials may alternatively be employed in some embodiments, though etch selectivity between the ILD layer 64 and the metal silicide should be provided. The ILD layer can be optionally cured using various known curing techniques including UV-light-assisted cure at below 400° C. A hard mask 66 is deposited on the structure and adjoins the top surfaces of the sacrificial gate layer 44 and the ILD layer 64. FIGS. 9A and 9B provide sectional views of the resulting structure 90.

Referring to FIGS. 10A and 10B, the hard mask 66 is patterned to form openings 68 therein. A trench 72 is formed in the sacrificial gate layer 44 and extends down to the bottom buried power rail 42. The trench 72 may be formed by a reactive ion etch or other suitable etching process. Portions of the top surface of the STI region 36 adjoining the bottom buried power rail 42 are also exposed, as schematically illustrated in the sectional view of the structure 110 shown in FIG. 11.

An electrically insulating layer 74 is deposited on the structure 110 and recessed. As shown in FIG. 12, the resulting structure 120 includes an electrically insulating layer 74 at the bottom of the trench 72 that adjoins the top surfaces of the bottom buried power rail 42 and the STI region 36. The electrically insulating layer 74 further adjoins opposing side walls of the trench 72. The electrically insulating layer 74 may be comprised of multiple layers. Exemplary dielectric materials used to form the insulating layer 74 may include silicon nitride, silicon dioxide, silicon carbide, silicon borocarbonitride (SiBCN) and combinations thereof. Both the oxide layer 62 and the electrically insulating layer 74 are configured to facilitate electrical isolation of the bottom power rail from a top buried power rail formed later in the process.

Figure 13:
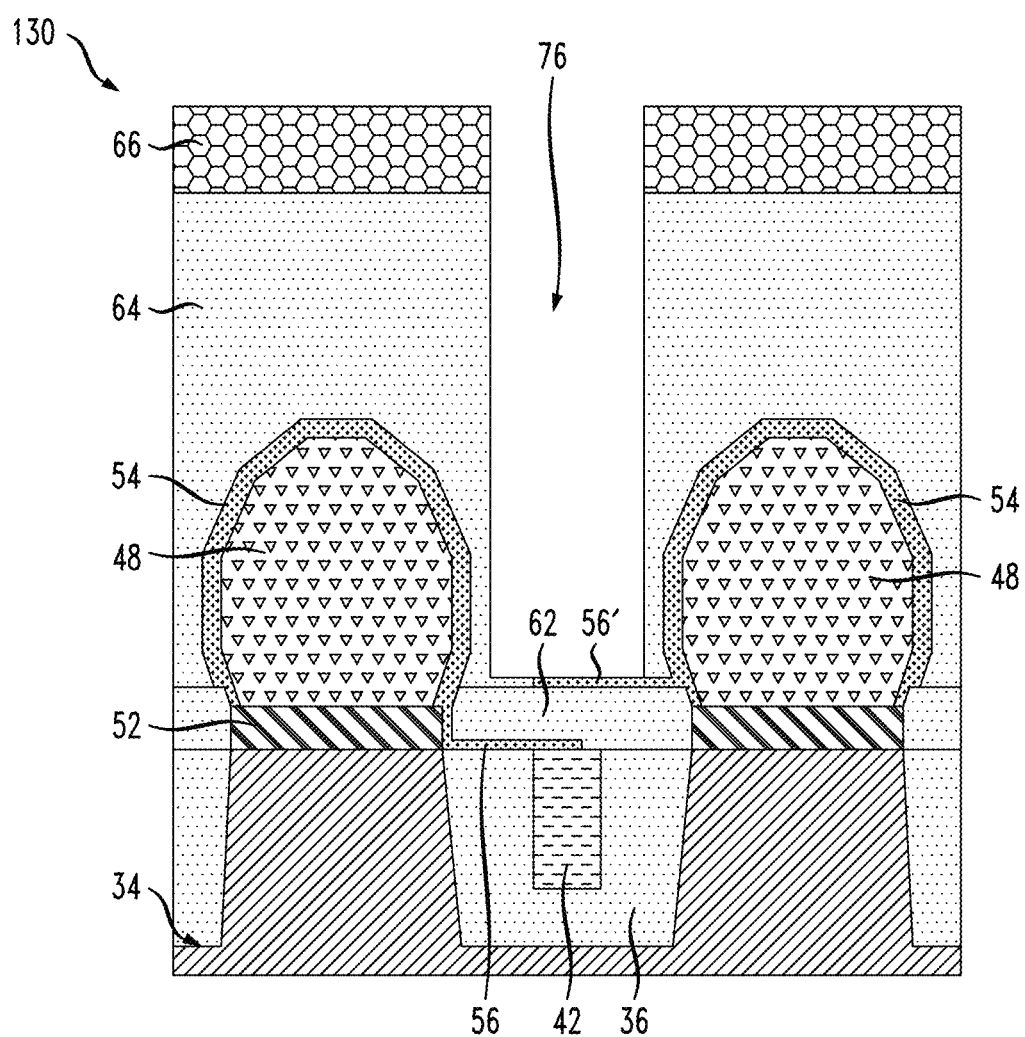
FIG. 13 is a schematic, cross-sectional view of the structure as shown in FIG. 12 following etching of the interlevel dielectric layer down to the electrically conductive connector.

A trench 76 is formed in the ILD layer 64 down to the electrical connector 56' extending from the wrap-around contact layer on one of the source/drain regions 48, as illustrated in FIG. 13. The trench 76 is vertically aligned with an opening in the hard mask 66. A dry etch (for example, a reactive ion etch) may be employed to form the trench 76. The etching selectively removes a portion of the ILD layer 64 in embodiments wherein the compositions of the ILD layer 64 and the oxide layer 62 are different In embodiments wherein the same material is used for both layers, the etch is stopped upon reaching the metal layer forming the top electrical connector 56' (for example, TiN). The top surface of the electrical connector 56' is exposed following trench formation. A monolithic structure 130 as shown in FIG. 13 may be obtained. In some exemplary embodiments, both the WACs 54 and the electrical connectors 56, 56' are metal. In other exemplary embodiments, the WACs are metal silicide and the electrical connectors 56, 56' are metal (not metal silicides).

Figure 14A:
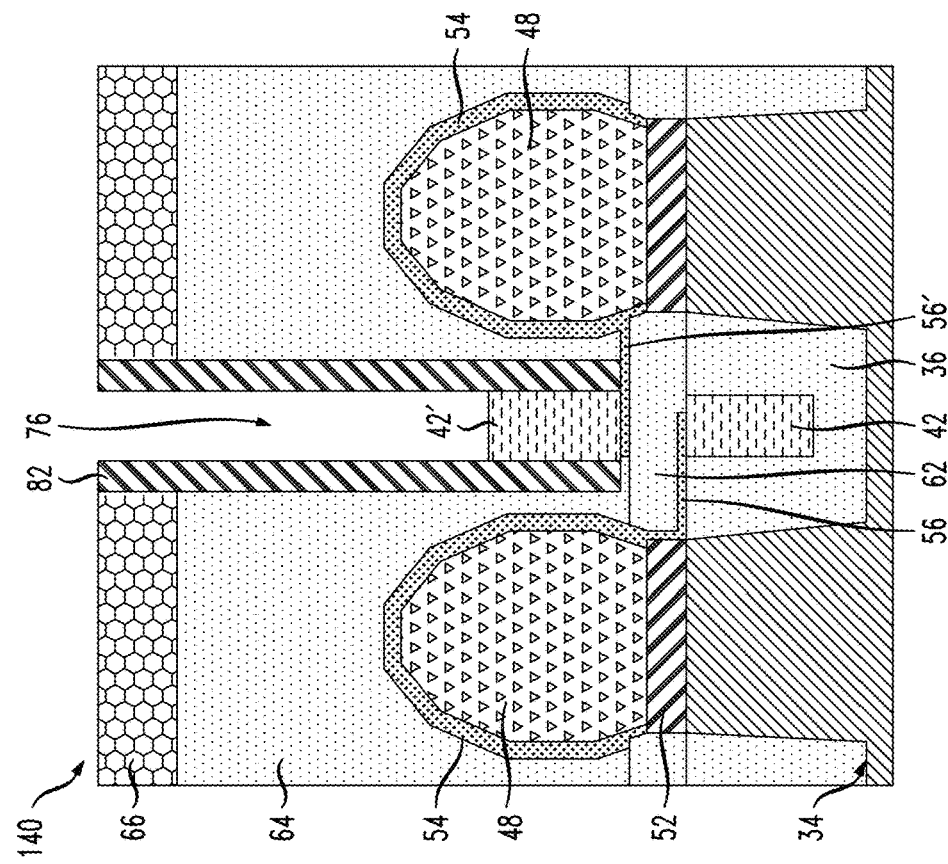
FIG. 14A is a schematic, cross-sectional view of the structure as shown in FIG. 13 following deposition of an insulating layer and top buried power rail formation.
Figure 14B:
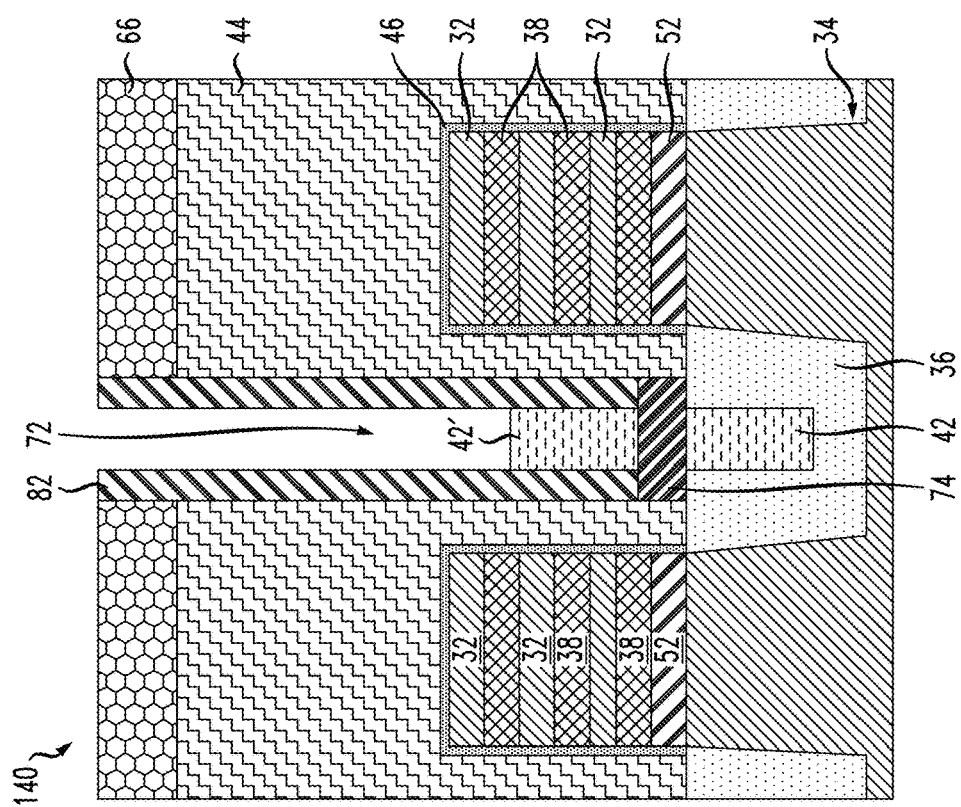
FIG. 14B is a further schematic, cross-sectional view of the structure shown in FIG. 13 following deposition of an insulating layer and top buried power rail formation.

An insulating layer 82 and a top buried power rail 42' are formed to obtain the exemplary structure 140 depicted in FIG. 14A and FIG. 14B. In an exemplary embodiment, a conformal layer of a dielectric material such as silicon nitride is deposited on the monolithic structure 130. Unwanted material can be removed using an anisotropic etch such as RIE or a plasma etch. The insulating layer 82 lines the side walls of the trenches within the sacrificial gate layer 44 and the ILD layer 64. As shown in FIG. 14A, the bottom of the insulating layer 82 adjoins the top surface of the electrically insulating layer 74. It also adjoins the top surface of the top one of the electrical connectors 56' in this exemplary embodiment, leaving an end portion thereof exposed as shown in FIG. 14B. The top buried power rail 42' is formed on the exposed end portion of the top one of the electrical connectors, thereby forming an electrical connection therebetween. The techniques and material(s) employed for forming the bottom buried power rail 42 may also be used to form the top buried power rail 42'. The top buried power rail is positioned laterally between the nanosheet structures and directly above and vertically aligned with the bottom buried power rail 42.

The trenches 72, 76 in the sacrificial gate layer 44 and the ILD layer 64 are filled with dielectric material to obtain a monolithic structure 150 as schematically illustrated in FIG. 15A and FIG. 15B. The dielectric material filling the trenches 72, 76 may be the same material as that employed to form the insulating layer 82. The insulating layer and fill layer together form a dielectric layer 82' that encapsulates the top buried power rail 42'.

The hard mask 66 and sacrificial gate layer 44 are selectively removed, thereby obtaining a monolithic structure 160 as depicted in FIGS. 16A and 16B. Removal of the sacrificial gate exposes the thin oxide liner 46 over the nanosheet stacks. The top and bottom buried power rails remain embedded within dielectric materials comprising the insulating layer 82', the STI region 36, and the oxide layer 62. The ILD layer 64 remains substantially intact.

The oxide liner 46 is removed from the nanosheet stacks to expose the silicon and silicon germanium layers comprising the nanosheet stacks. Once the oxide liner and the sacrificial gate layer 44 have been removed, the silicon germanium layers 38 are removed using an etching process that is selective to the silicon nanosheet channel layers 32. Hydrogen chloride gas is employed in some embodiments to selectively remove silicon germanium, leaving the silicon nanosheets 32 substantially intact. Alternatively, a wet etch process containing ammonia and hydroperoxide can be used to etch SiGe selective to other materials. As shown in the exemplary structure 170 illustrated in FIG. 17, horizontal spaces 84 are formed between the silicon (channel) nanosheet layers 32 as well as between the bottom silicon nanosheet channel layer 32 and the BDI layer 52. The horizontal spaces between nanosheet (channel) layers may be about six to eighteen nanometers (6-18 nm) in height. The dimension ranges of the channel layers and horizontal spaces should be considered exemplary as opposed to limiting.

Gate stacks including gate dielectric and gate metal layers are formed on the structure and fill the horizontal spaces 84. A gate dielectric layer 86 forms portions of the gate stacks that replace the sacrificial silicon germanium layers 38. The gate stacks adjoin the silicon nanosheet channel layers 38 and extend down to a bottom dielectric isolation (BDI) layer 52 and/or the STI region 36. Non-limiting examples of suitable materials for the gate dielectric layer include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric layer 86 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In one exemplary embodiment, a high-k dielectric layer having a thickness of 2.5 nm is employed. In some embodiments, the gate dielectric layer incudes multiple layers.

Electrically conductive gate material is deposited in the trenches formerly containing the sacrificial gates 44 and the spaces 84 formerly filled by the silicon germanium layers 38. The deposited metal gate material forms the metal gate 88 of the resulting nanosheet field-effect transistors. As shown in FIG. 18, the deposited gate metal additionally forms gate electrode portions that extend vertically above the stacks of nanosheet channel layers of the nanosheet transistors. Non-limiting examples of suitable electrically conductive metals for forming the metal gate include aluminum (Al), platinum (Pt), gold (Au), silver (Ag), tungsten (W), titanium (Ti), cobalt (Co), or any combination thereof. The gate metal may be deposited using processes such as CVD, PECVD, PVD, plating, or thermal or e-beam evaporation. A planarization process, for example, chemical mechanical planarization (CMP), is performed to polish the top surface of the deposited gate metal material that may form on the structure.

In some embodiments, the electrically conductive gate includes a work function metal (WFM) layer disposed between the gate dielectric layer and another electrically conductive metal gate material. The WFM layer may include multiple WFM layers made from different materials. The WFM sets the transistor characteristics such as threshold voltage (Vt) to a predetermined value. In some embodiments, the WFM serves dual purposes: Vt setting and gate conductor. Due to spacing limitations between the silicon nanosheet channel layers 32, WFM deposition is self-limiting. WFM thickness between channel regions may accordingly vary due to differences in spacing between the channel regions.

Threshold voltage can be modulated through WFM thickness as well as the inter-nanosheet (channel) spacing. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process. The nanosheet FET structures at this stage of the exemplary fabrication process includes nanosheet channel regions, operatively associated gate stacks (86, 88), doped epitaxial source and drain regions 48, and possibly doped extension regions (not shown) between the channel regions of the nanosheet channel layers 32 and the source/drain regions 48. A top dielectric layer 92 such as a silicon nitride layer is formed on the top surface of the gate electrode to complete the exemplary structure 180 shown in FIG. 18.

Openings are formed in the top dielectric layer 92 to expose selected portions of the gate electrodes. Gate contacts 94 are formed within the openings. In some embodiments, the contact metal layer is a tungsten (W) layer that is deposited using a tungsten hexafluoride source with silane. Chemical vapor deposition conducted between 300-400° C. and using tungsten hexafluoride precursor chemistry may, for example, be employed to deposit a tungsten layer. Contact material may, for example, alternatively include tantalum (Ta), aluminum (Al), platinum (Pt), gold (Au), titanium (Ti), palladium (Pd) or any combination thereof. The contact material may be deposited by, for example, CVD, PECVD, PVD, plating, thermal or e-beam evaporation, or sputtering. Metal overburden can be removed using chemical mechanical planarization. FIGS. 19A and 19B provide sectional views of an exemplary monolithic structure that may be obtained using processes as described above. The cross-sectional view provided in FIG. 19A is taken across the gate and channel regions of adjoining, electrically isolated nanosheet transistors. FIG. 19B is a cross sectional view taken across the epitaxial source/drain regions 48 thereof.

A sectional view of an alternative embodiment of a structure 200 formed in accordance with the principles described herein is provided in FIG. 20. In contrast to the structure illustrated in FIG. 19B, the nanosheet transistors in this view are both electrically connected to the top buried power rail 42' while neither is connected to the bottom buried power rail 42. The electrical connector 56" may be formed as part of a process similar to that described above with respect to FIG. 7, but causing the deposition of metal entirely across the top surface of the oxide layer 62 rather than only partially across as shown.

FIG. 21 is a sectional view showing a further alternative embodiment of a monolithic structure 210 that may be obtained using techniques as described herein. The structure 210 includes an electrical connector 56''' that connects the metal silicide layer on each of the illustrated source/drain regions 48 to the bottom buried power rail 42. Neither source/drain region is electrically connected to the top buried power rail 42' in this exemplary embodiment. The electrical connector 56''' extends completely across the top surface of the STI region 36 and contacts the top surface of the bottom buried power rail 42. The electrical connector may be formed on the structure illustrated in FIG. 4B at the same time that the wrap-around contacts are formed on the source/drain regions 48. It will be appreciated that the structures shown in FIGS. 19A, 19B, 20 and 21 can all be formed simultaneously on the same wafer through the use of one or more patterned masks that protect some portions of the wafer while exposing others.

Figure 22:
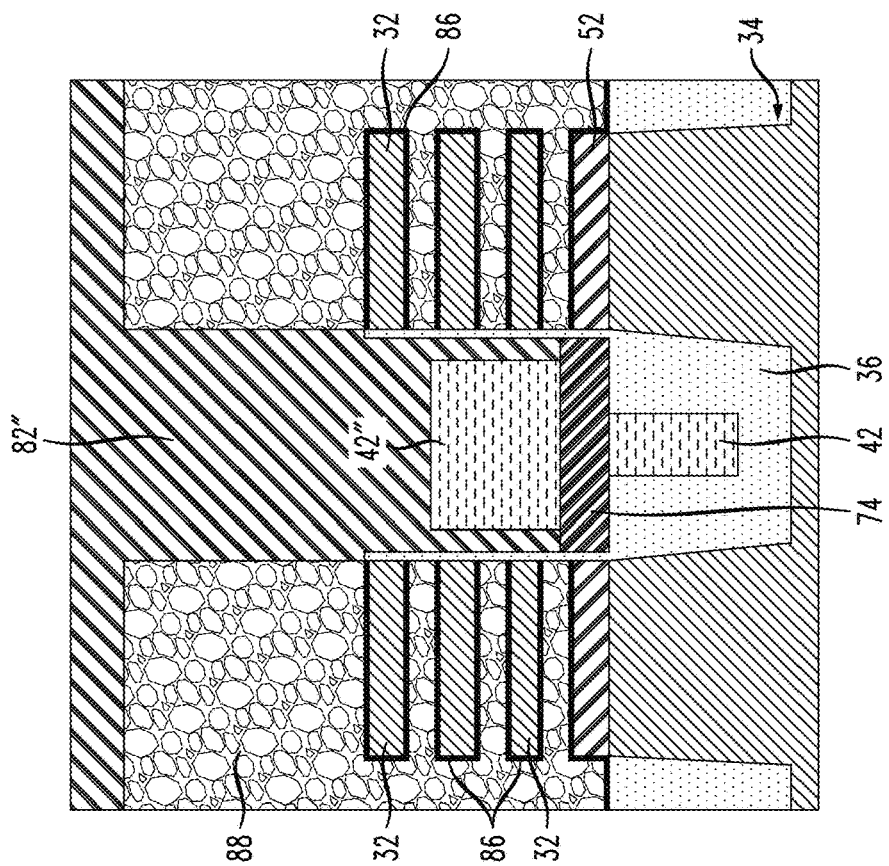
FIG. 22 is a schematic, cross-sectional view of a semiconductor structure in accordance with a third alternative embodiment.

A further exemplary embodiment includes top and bottom buried power rails 42", 42 having different dimensions. In this embodiment, the top buried power rail 42" has a greater width than the bottom buried power rail 42, as schematically illustrated in FIG. 22. The dielectric layer 82" in which the top buried power rail 42" is embedded is relatively wide and may equal the width of the top surface of the STI region 36. In contrast, the width of the dielectric layer 82' in the exemplary structure 190 shown in FIG. 19A is significantly smaller than the width of the top surface of the STI region 36 and the buried power rails have the same height and width dimensions.

Figure 23:
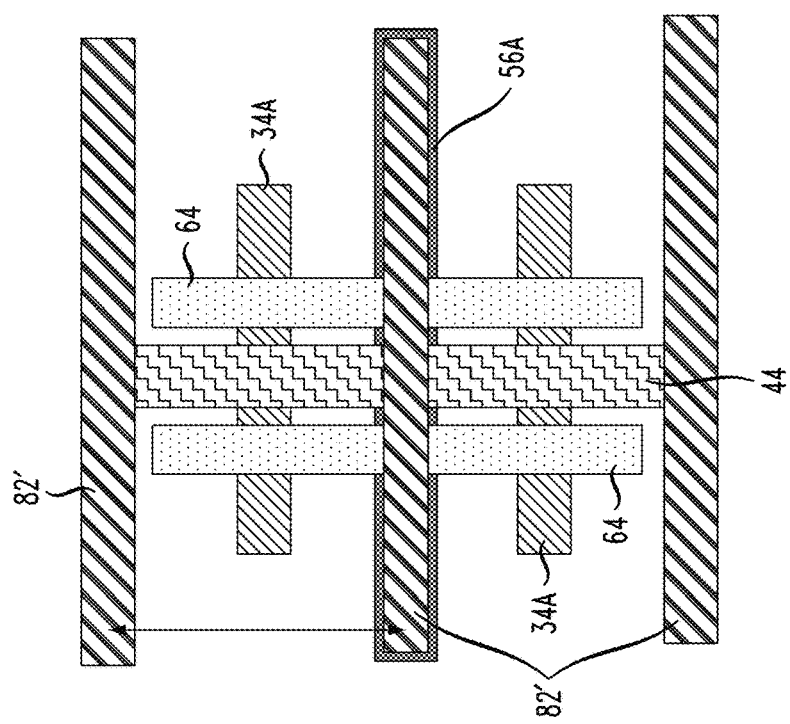
FIG. 23 is a schematic, top plan view showing elements of an exemplary semiconductor structure including vertically stacked, buried power rails.

FIG. 23 is a top plan view showing elements formed on a portion of a wafer during a stage of manufacture of devices as discussed above. Two active regions 34A are formed by a pair of parallel semiconductor fin segments. A sacrificial gate 44 extends perpendicularly with respect to the fin segments and over the channel regions (not shown). ILD layers 64 are on opposite sides of the sacrificial gate layer and parallel thereto. As discussed above, the source/drain regions (not shown) on each side of the channel regions are embedded within the ILD layers 64. Dielectric layers 82' extend through trenches formed in the ILD layers and sacrificial gate layer 44. The top and bottom buried power rails (not shown) are vertically aligned with one of the dielectric layers 82', the top buried power rail being partially embedded therein (as shown in FIG. 15B). The vertically stacked top and bottom buried power rails (not shown in FIG. 23) run parallel to the fin segments and are electrically connected to the metal silicide layers (not shown in FIG. 23) that form wrap-around contacts on the source/drain regions. Electrical connectors for connecting buried power rails to metal silicide layers are discussed above. The electrical connectors 56A shown schematically in FIG. 23 may be vertically spaced elements connected, respectively, to top and bottom buried power rails, or alternatively may be coplanar elements that are both connected to one of the top and bottom buried power rails. Portions of the electrical connectors 56A run parallel to the fin segments. The configuration of elements depicted in FIG. 23 provides benefits of scale with respect to configurations wherein each cell connection comprises two laterally spaced, buried power rails. The arrow between parallel dielectric layers 82' indicates a dimension that can be reduced using power rail configurations described herein.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling 1st Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary semiconductor structure includes a semiconductor substrate 34 including a first active region and a second active region, the first active region being electrically isolated from the second active region, a first field-effect transistor on the first active region, the first field-effect transistor including a first gate structure (e.g. metal gate 88), a first channel region (e.g. semiconductor nanosheet channel layers 32), and a first pair of source/drain regions 48 adjoining the first channel region. A first electrically conductive liner (wrap-around contacts 54) is on each source/drain region of the first field-effect transistor and can be a silicide liner. A second field-effect transistor on the second active region includes a second gate structure (e.g. metal gate 88), a second channel region, and a second pair of source/drain regions 48 adjoining the second channel region. A bottom buried power rail 42 is between the first and second active regions. A top buried power rail 42' is vertically above the bottom power rail. An electrical isolation layer, for example layer 74 and layer 62 in FIG. 19A and FIG. 19B, respectively, is between the bottom buried power rail 42 and the top buried power rail 42'. A first electrical connector electrically connects the first electrically conductive liner and one of the bottom buried power rail and the top buried power rail and a second electrical connector electrically connects the second electrically conductive liner and one of the bottom buried power rail and the top buried power rail. Exemplary arrangements of electrical connectors for connecting the buried power rails to FETs are schematically illustrated in FIGS. 19B, 20 and 21. In some embodiments, the electrically conductive liner 54 in one of the first and second active regions comprises a p-type work function metal while the electrically conductive liner in the other of the first and second active regions comprises an n-type work function metal. In other embodiments, the work function metal in both active regions is the same.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having nanosheet or other FET devices and vertically stacked, buried power rails formed in accordance with one or more of the exemplary embodiments.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
   a semiconductor substrate including a first active region and a second active region, the first active region being electrically isolated from the second active region;
   a first field-effect transistor on the first active region, the first field-effect transistor comprising a first gate structure, a first channel region, and a first pair of source/drain regions adjoining the first channel region;
   a first electrically conductive liner on each source/drain region of the first field-effect transistor;
   a second field-effect transistor on the second active region, the second field-effect transistor comprising a second gate structure, a second channel region, and a second pair of source/drain regions adjoining the second channel region;
   a second electrically conductive liner on each source/drain region of the second field-effect transistor;
   a bottom buried power rail between the first and second active regions;
   a top buried power rail positioned vertically above the bottom power rail;
   an electrical isolation layer between the bottom buried power rail and the top buried power rail;
   a first electrical connector electrically connecting the first electrically conductive liner and one of the bottom buried power rail and the top buried power rail; and
   a second electrical connector electrically connecting the second electrically conductive liner and one of the bottom buried power rail and the top buried power rail.

2. The semiconductor structure of claim 1, wherein the first electrically conductive liner comprises a first wrap-around metal silicide liner and the second electrically conductive liner comprises a second wrap-around metal silicide liner.

3. The semiconductor structure of claim 2, further including a shallow trench isolation region extending within the semiconductor substrate and between the first active region and the second active region, wherein the first electrical connector is electrically connected to the bottom buried power rail and extends over the shallow trench isolation region and beneath the electrical isolation layer.

4. The semiconductor structure of claim 3, wherein the second electrical connector extends over the electrical isolation layer and is electrically connected to the top buried power rail.

5. The semiconductor structure of claim 4, wherein the bottom buried power rail is embedded within the shallow trench isolation region.

6. The semiconductor structure of claim 5, wherein the first active region and the second active region comprise, respectively, a first semiconductor fin and a second semiconductor fin parallel to the first semiconductor fin, the electrical isolation layer being on the shallow trench isolation region.

7. The semiconductor structure of claim 6, wherein the top buried power rail has a greater width than the bottom buried power rail.

8. The semiconductor structure of claim 6, wherein the first field-effect transistor and the second field-effect transistor are nanosheet transistors or FinFET transistors.

9. The semiconductor structure of claim 6, wherein the second electrical connector includes a horizontally extending end portion overlapping a horizontally extending portion of the first electrical connector.

10. The semiconductor structure of claim 1, wherein the first electrical connector and the second electrical connector are integral, respectively, with the first electrically conductive liner and the second electrically conductive liner.

11. The semiconductor structure of claim 10, wherein:
    the first electrical connector is electrically connected to the bottom buried power rail and extends horizontally over a shallow trench isolation region extending within the semiconductor substrate and beneath the electrical isolation layer; and
    the second electrical connector is electrically connected to the top buried power rail and extends horizontally over the electrical isolation layer.

12. The semiconductor structure of claim 10, wherein:
    the first electrical connector is electrically connected to the bottom buried power rail and extends horizontally over the shallow trench isolation region and beneath the electrical isolation layer; and
    the second electrical connector is electrically connected to the bottom buried power rail and extends horizontally over the shallow trench isolation region and beneath the electrical isolation layer.

13. The semiconductor structure of claim 10, wherein:
    the first electrical connector is electrically connected to the top buried power rail and extends horizontally over the electrical isolation layer; and
    the second electrical connector is electrically connected to the top buried power rail and extends horizontally over the electrical isolation layer.

14. The semiconductor structure of claim 10, wherein the first electrical connector and the first electrically conductive liner comprise different electrically conductive materials.

15. The semiconductor structure of claim 10, wherein the first gate structure comprises an n-type work function metal and the second gate structure comprises a p-type work function metal.

16. A method of forming a semiconductor structure including vertically stacked, buried power rails, comprising:
    obtaining a monolithic semiconductor structure including a first active region, a second active region, and an electrical isolation region between the first active region and the second active region, the first active region including a first channel region and the second active region including a second channel region;
    forming a bottom buried power rail within the electrical isolation region;

forming a sacrificial gate layer over the first and second active regions and adjoining the first channel region and the second channel region;
epitaxially forming a first pair of source/drain regions on opposite sides of the first channel region;
forming a first electrically conductive liner on the first pair of source/drain regions;
epitaxially forming a second pair of source/drain regions on opposite sides of the second channel region;
forming a second electrically conductive liner on the second pair of source/drain regions;
forming an electrical isolation layer over the bottom buried power rail;
forming a top buried power rail vertically above the bottom buried power rail, the top buried rail being electrically isolated from the bottom buried rail by the electrical isolation layer;
forming a first metal connector extending laterally from the first electrically conductive liner and contacting one of the bottom buried power rail and the top buried power rail;
forming a second metal connector extending laterally from the second electrically conductive liner and contacting one of the bottom buried power rail and the top buried power rail; and
depositing a dielectric layer over the top buried power rail.

17. The method of claim 16, further including forming the second metal connector above and electrically isolated from the first electrical connector.

18. The method of claim 17, further including:
forming an interlevel dielectric layer over the first pair of source/drain regions and the second pair of source/drain regions;
forming a first vertical trench within the interlevel dielectric layer, the first vertical trench extending down to the second electrical conductor;
forming a second vertical trench within the sacrificial gate layer;
wherein forming the top buried power rail further includes depositing an electrically conductive metal within the first vertical trench and the second vertical trench.

19. The method of claim 18, wherein the second vertical trench extends down to a top surface of the bottom buried power rail and forming the electrical isolation layer further includes forming an electrical insulator within the second vertical trench and adjoining the top surface of the bottom buried power rail.

20. The method of claim 18, wherein the first channel region comprises a first stack of semiconductor nanosheet layers and the second channel region comprises a second stack of semiconductor nanosheet layers.

* * * * *